(12) United States Patent
Uetani

(10) Patent No.: US 10,897,003 B2
(45) Date of Patent: Jan. 19, 2021

(54) LAMINATED CERAMIC ELECTRONIC COMPONENT AND ELECTRONIC COMPONENT ASSEMBLY

(71) Applicant: NGK Insulators, Ltd., Nagoya (JP)

(72) Inventor: Masayuki Uetani, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/502,213

(22) Filed: Jul. 3, 2019

(65) Prior Publication Data

US 2020/0020844 A1 Jan. 16, 2020

(30) Foreign Application Priority Data

Jul. 10, 2018 (JP) ................. 2018-130839

(51) Int. Cl.
| | |
|---|---|
| *G11C 11/00* | (2006.01) |
| *H01L 41/047* | (2006.01) |
| *G11B 21/21* | (2006.01) |
| *H01L 41/09* | (2006.01) |
| *H01L 41/083* | (2006.01) |

(52) U.S. Cl.
CPC .......... *H01L 41/0477* (2013.01); *G11B 21/21* (2013.01); *H01L 41/083* (2013.01); *H01L 41/09* (2013.01)

(58) Field of Classification Search
CPC ... H01L 41/0477; H01L 41/09; H01L 41/083; H01L 41/29; H01L 41/313; H01L 41/0815; H01L 41/0475; H01L 41/0472; G11B 21/21

USPC ........................................................ 365/157
See application file for complete search history.

(56) References Cited

U.S. PATENT DOCUMENTS

| | | | | |
|---|---|---|---|---|
| 6,201,337 | B1* | 3/2001 | Kaida | H03H 9/0207 310/321 |
| 2016/0099400 | A1* | 4/2016 | Uetani | H01L 41/083 310/363 |

FOREIGN PATENT DOCUMENTS

JP 2014-179396 A1 9/2014

* cited by examiner

*Primary Examiner* — Tha-O H Bui
(74) *Attorney, Agent, or Firm* — Burr & Brown, PLLC

(57) ABSTRACT

An opposite-side dielectric ceramic layer is in contact with a first opposite-surface electrode layer and a second opposite-surface electrode layer. A mounting-side dielectric ceramic layer is in contact with a first mounting-surface electrode layer and a second mounting-surface electrode layer. A mounting-side inner electrode layer is separated from the first mounting-surface electrode layer and the second mounting-surface electrode layer by the mounting-side dielectric ceramic layer, disposed on the mounting-side dielectric ceramic layer, extending from a first side-surface electrode layer, and separated from a second side-surface electrode layer. In a cross-sectional view including a lamination direction and a length direction, a position in which the second mounting-surface electrode layer has a maximum thickness is shifted toward a second side surface in the length direction with respect to a position in which the second opposite-surface electrode layer has a maximum thickness.

14 Claims, 16 Drawing Sheets

LAMINATED CERAMIC ELECTRONIC COMPONENT AND ELECTRONIC COMPONENT ASSEMBLY

FIELD OF THE INVENTION

The present invention relates to a laminated ceramic electronic component and an electronic component assembly.

DESCRIPTION OF THE BACKGROUND ART

Japanese Patent Application Laid-Open No. 2014-179396 discloses a piezoelectric element applicable to a suspension of a magnetic head. A fine positioning of the magnetic head is achieved when the piezoelectric element is displaced in a longitudinal direction. The piezoelectric element has a plurality of piezoelectric layers laminated on each other in a lamination direction perpendicular to the longitudinal direction. The piezoelectric element has a pair of electrodes, and the displacement occurs in accordance with a voltage applied to the pair of electrodes. Each of the pair of electrodes has an inner layer electrode and a surface electrode. The surface electrode has a portion formed on a lower surface of the piezoelectric element. A suspension has a first portion, a second portion, and a space therebetween, and the piezoelectric element is mounted over the first portion and second portion of the suspension. Specifically, the surface electrode on the lower surface of the piezoelectric element is mounted on the suspension via a conductive material.

A conductive material (conductive member) for mounting a piezoelectric element (laminated ceramic electronic component) can be formed from a conductive paste (electrode material having flowability). Specifically, firstly, the conductive paste is applied on each of the first portion (first conductive part) and the second portion (second conductive part) of the suspension (mounted member). Next, a lower surface (mounting surface) of the laminated ceramic electronic component is pressed on the conductive paste. Next, the conductive paste is cured by thermal processing, thus the conductive member is formed.

When the laminated ceramic electronic component is pressed on the conductive paste as described above, a flow of the conductive paste occurs. In accordance with this flow, part of the conductive paste may get close to an inner layer electrode (inner electrode) of the laminated ceramic electronic component. As a result, a distance from the conductive member made from the conductive paste to the inner layer electrode (inner electrode) may be smaller than a distance desired to ensure insulation property. In that case, insulation reliability of an electronic component assembly having the laminated ceramic electronic component and the mounted member, specifically the insulation reliability under high humidity, cannot be sufficiently ensured.

SUMMARY OF THE INVENTION

The present invention therefore has been made to solve these problems, and it is an object of the present invention to provide a laminated ceramic electronic component capable of obtaining high insulation reliability in case of being mounted using a conductive paste. Another object is to provide an electronic component assembly using this laminated ceramic electronic component.

A laminated ceramic electronic component according to the present invention has a mounting surface which is to be joined to a mounted member using a conductive member, an opposite surface located opposite to the mounting surface in a lamination direction, a first side surface connecting the mounting surface and the opposite surface, and a second side surface connecting the mounting surface and the opposite surface and located opposite to the first side surface in a length direction. The laminated ceramic electronic component has a first side-surface electrode layer, a second side-surface electrode layer, a first opposite-surface electrode layer, a second opposite-surface electrode layer, a first mounting-surface electrode layer, a second mounting-surface electrode layer, an opposite-side dielectric ceramic layer, a mounting-side dielectric ceramic layer, and a mounting-side inner electrode layer. The first side-surface electrode layer is disposed on a first or second side surface. The second side-surface electrode layer is disposed on the second side surface. The first opposite-surface electrode layer is disposed on the opposite surface, and is connected to the first side-surface electrode layer. The second opposite-surface electrode layer is disposed on the opposite surface, connected to the second side-surface electrode layer, and separated from the first opposite-surface electrode layer. The first mounting-surface electrode layer is disposed on the mounting surface, and is connected to the first side-surface electrode layer. The second mounting-surface electrode layer is disposed on the mounting surface, connected to the second side-surface electrode layer, and separated from the first mounting-surface electrode layer. An opposite-side dielectric ceramic layer is in contact with the first opposite-surface electrode layer and the second opposite-surface electrode layer. A mounting-side dielectric ceramic layer is in contact with the first mounting-surface electrode layer and the second mounting-surface electrode layer. The mounting-side inner electrode layer is separated from the first mounting-surface electrode layer and the second mounting-surface electrode layer by the mounting-side dielectric ceramic layer, disposed on the mounting-side dielectric ceramic layer, extending from the first side-surface electrode layer, and separated from the second side-surface electrode layer. In a cross-sectional view including a lamination direction and a length direction, a position in which the second mounting-surface electrode layer has a maximum thickness is shifted toward the second side surface in the length direction with respect to a position in which the second opposite-surface electrode layer has a maximum thickness.

According to the laminated ceramic electronic component of the present invention, in the cross-sectional view including the lamination direction and the length direction, the position in which the second mounting-surface electrode layer has the maximum thickness is shifted toward the second side surface in the length direction with respect to the position in which the second opposite-surface electrode layer has the maximum thickness. In this case, according to a study of the present inventor, when the mounting surface of the laminated ceramic electronic component is pressed on the conductive paste by applying a load to the opposite surface for mounting the laminated ceramic electronic component, a flow of the conductive paste below the mounting surface tends to move along the length direction. As a result, the excessive rise of the conductive paste along the lamination direction is avoided on the longitudinal surface surrounded by the mounting surface, the opposite surface, the first side surface, and the second side surface. Avoided thereby is the excessive decrease in the distance from the conductive paste on the longitudinal surface to the inner electrode. Thus, avoided is the excessive decrease in the distance from the conductive member made from the conductive paste to the inner electrode. As described above, high insulation reliability can be ensured when the laminated ceramic electronic component is mounted using the conductive paste.

These and other objects, features, aspects and advantages of the present invention will become more apparent from the following detailed description of the present invention when taken in conjunction with the accompanying drawings.

DETAILED DESCRIPTION OF THE INVENTION

Figure 1:
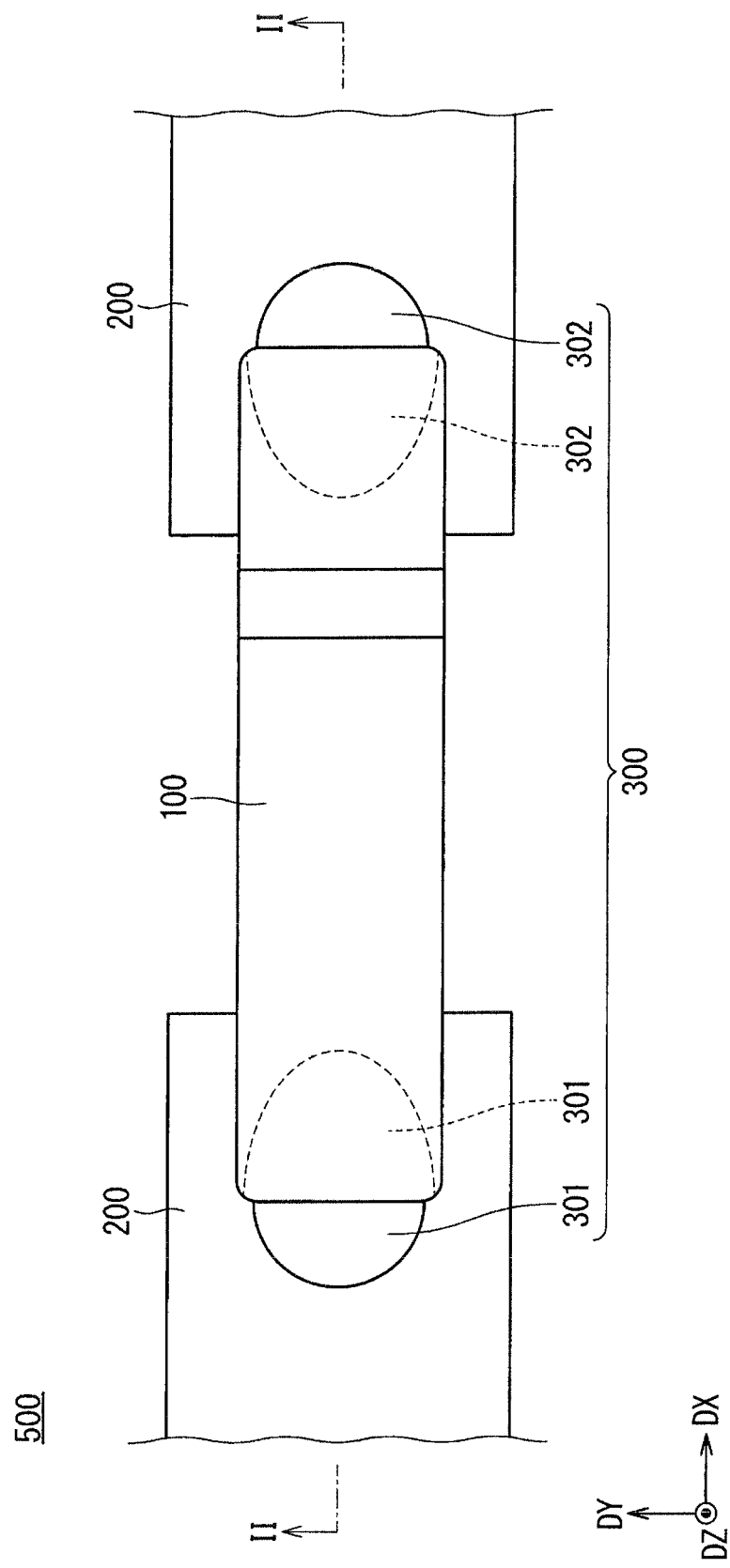
FIG. 1 is a top view schematically illustrating a configuration of an electronic component assembly in an embodiment 1 of the present invention.

Embodiments of the present invention are described hereinafter based on the drawings. The same reference numerals will be assigned to the same or corresponding constituent elements in the drawings hereinafter, and the description on them is not repeated.

Embodiment 1

(Configuration)

Figure 2:
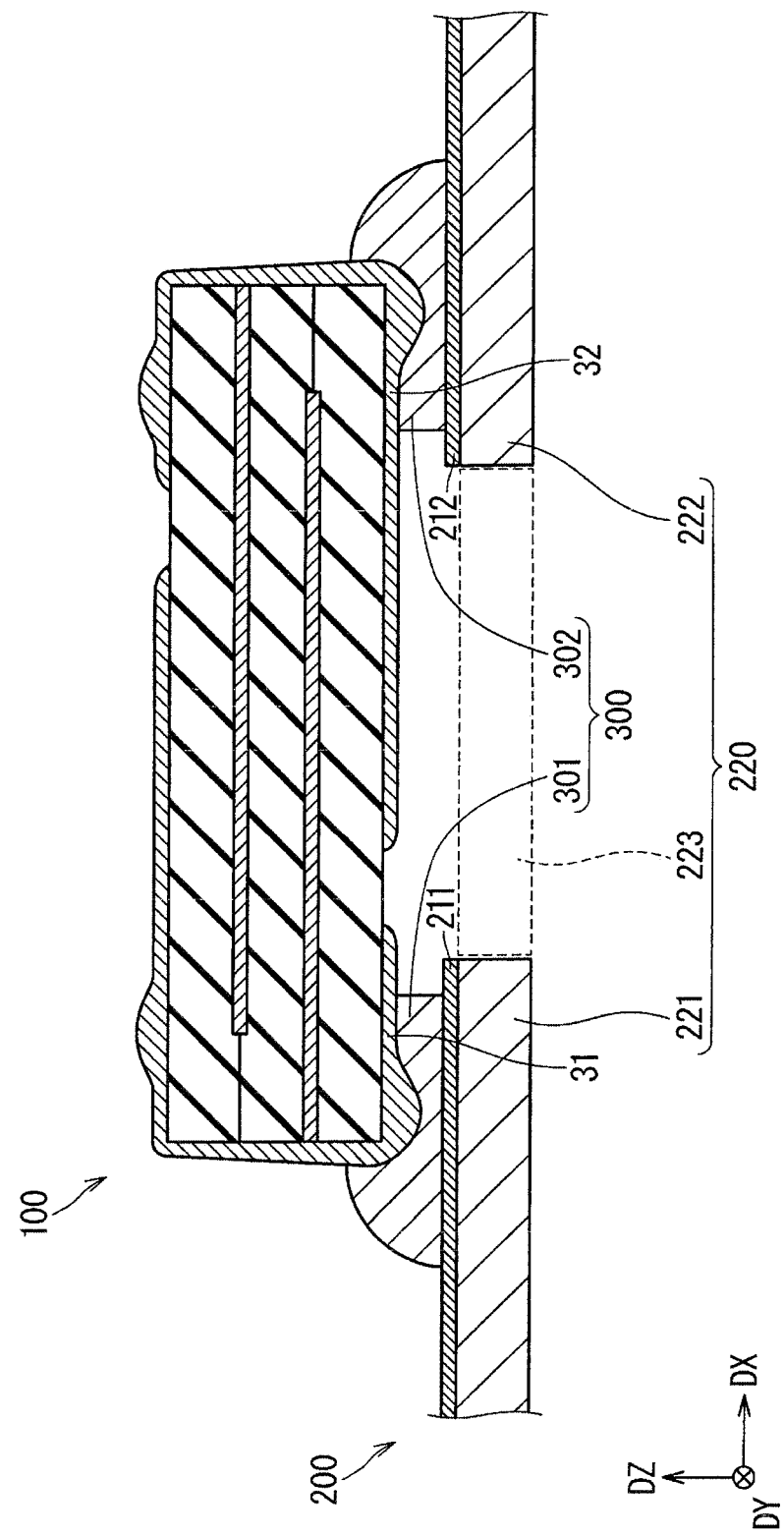
FIG. 2 is a schematic cross-sectional view along a line II-II in FIG. 1.

FIG. 1 is a top view schematically illustrating a configuration of an electronic component assembly 500 in a present embodiment 1. FIG. 2 is a schematic cross-sectional view along a line II-II in FIG. 1. A length direction DX, a width direction DY, and a lamination direction DZ perpendicular to each other are illustrated in the drawings for a purpose of illustration.

The electronic component assembly 500 has a laminated ceramic electronic component 100, a mounted member 200, and a conductive member 300. The laminated ceramic electronic component 100 is an actuator element to generate displacement in the length direction DX. A configuration of the laminated ceramic electronic component 100 is described hereinafter.

The mounted member 200 has a first conductive part 211 and a second conductive part 212 separated from each other. The mounted member 200 has a support 220. The support 220 has a first support part 221 supporting the first conductive part 211, a second support part 222 supporting the second conductive part 212, and a space 223 located between the first support part 221 and the second support part 222. The space 223 is provided, thus a displacement between the first conductive part 211 on the first support part 221 and the second conductive part 212 on the second support part 222 can be generated with a smaller strength.

The conductive member 300 has a first junction part 301 and a second junction part 302. The first junction part 301 joins a first mounting-surface electrode layer 31 of the laminated ceramic electronic component 100 to the first conductive part 211 of the mounted member 200. The second junction part 302 joins a second mounting-surface electrode layer 32 of the laminated ceramic electronic component 100 to the second conductive part 212 of the mounted member 200.

Figure 3:
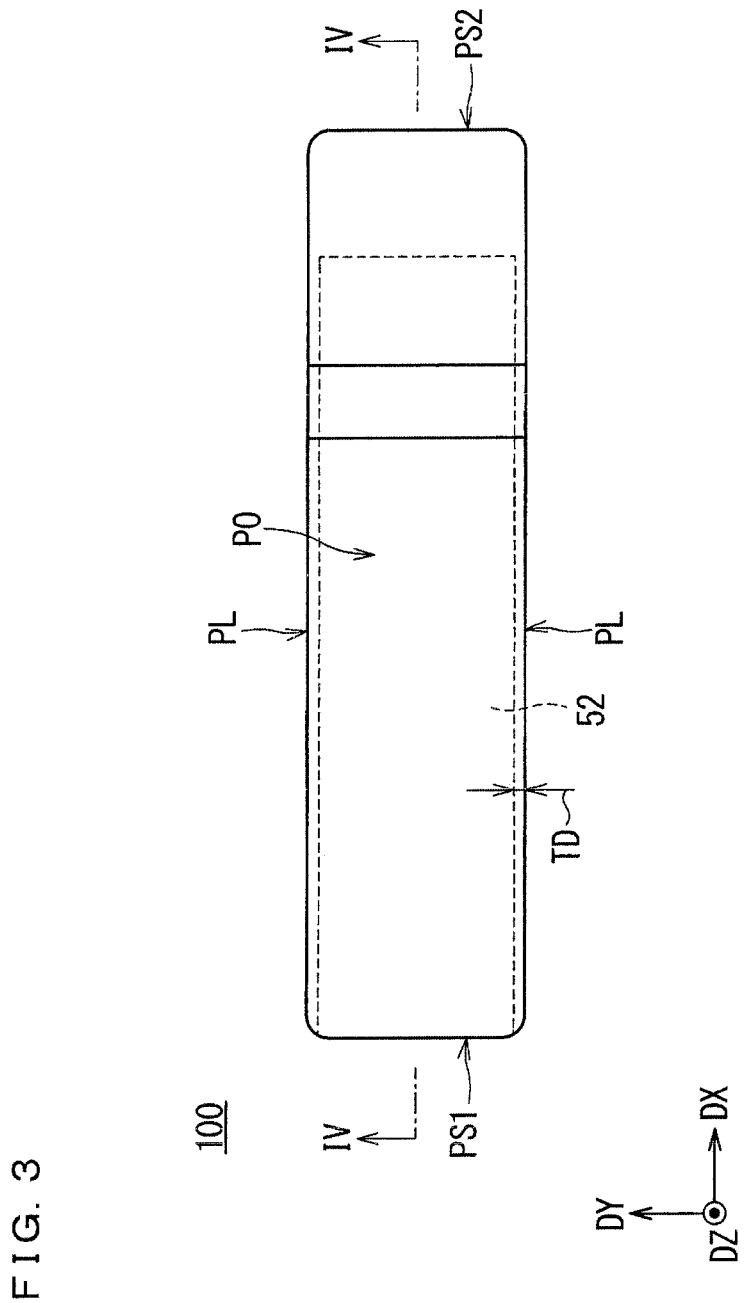
FIG. 3 is a top view schematically illustrating a configuration of a laminated ceramic electronic component in the embodiment 1 of the present invention.
Figure 4:
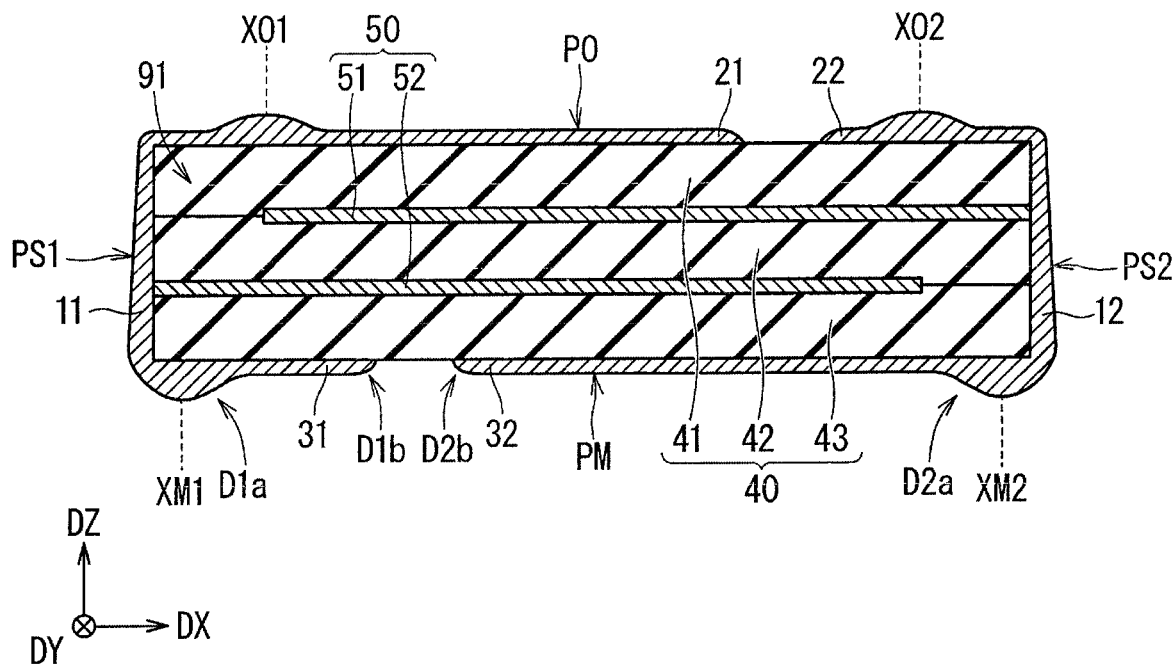
FIG. 4 is a schematic cross-sectional view along a line IV-IV in FIG. 3.
Figure 5:
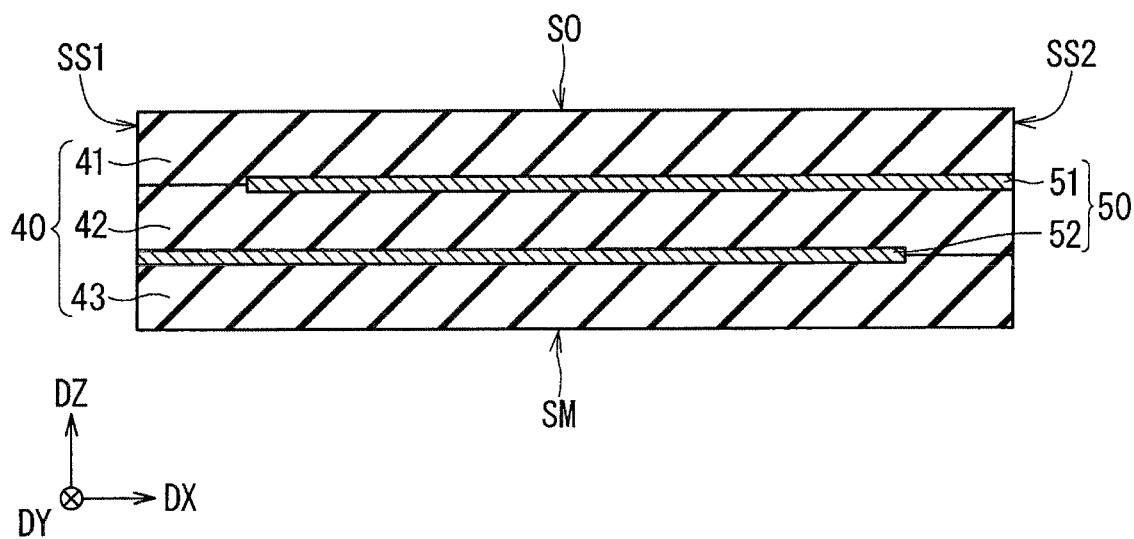
FIG. 5 is a cross-sectional view schematically illustrating a configuration of a laminated body included in the laminated ceramic electronic component in FIG. 4.

FIG. 3 is a top view schematically illustrating a configuration of the laminated ceramic electronic component 100. FIG. 4 is a schematic cross-sectional view along a line IV-IV in FIG. 3. FIG. 5 is a cross-sectional view schematically illustrating a configuration of a laminated body 91 included in the laminated ceramic electronic component 100.

The laminated ceramic electronic component 100 has a mounting surface PM (FIG. 4) which is to be joined to the mounted member 200 (FIG. 1 and FIG. 2) using the conductive member 300 (FIG. 1 and FIG. 2), an opposite surface PO (FIG. 4) located on opposite side of the mounting surface PM in the lamination direction DZ, a first side surface PS1 (FIG. 4) connecting the mounting surface PM and the opposite surface PO, and a second side surface PS2 (FIG. 4) connecting the mounting surface PM and the opposite surface PO and located opposite to the first side surface PS1 in the length direction DX. The laminated ceramic electronic component 100 has a longitudinal surface PL (FIG. 3) surrounded by the mounting surface PM, the opposite surface PO, the first side surface PS1, and the second side surface PS2.

The laminated ceramic electronic component 100 (FIG. 4) has a first side-surface electrode layer 11, a second side-surface electrode layer 12, a first opposite-surface electrode layer 21, a second opposite-surface electrode layer 22, the first mounting-surface electrode layer 31, the second mounting-surface electrode layer 32, and the laminated body 91. The first side-surface electrode layer 11 is disposed on the first side surface PS1. The second side-surface electrode layer 12 is disposed on the second side surface PS2. The first opposite-surface electrode layer 21 is disposed on the opposite surface PO, and is connected to the first side-surface electrode layer 11. The second opposite-surface electrode layer 22 is disposed on the opposite surface PO, connected to the second side-surface electrode layer 12, and separated from the first opposite-surface electrode layer 21. The first mounting-surface electrode layer 31 is disposed on the mounting surface PM, and is connected to the first side-surface electrode layer 11. The second mounting-surface electrode layer 32 is disposed on the mounting surface PM, connected to the second side-surface electrode layer 12, and separated from the first mounting-surface electrode layer 31.

In a cross-sectional view (FIG. 4) including the lamination direction DZ and the length direction DX, a position XM2 in which the second mounting-surface electrode layer 32 has a maximum thickness is shifted toward the second side surface PS2 in the length direction DX with respect to a position XO2 in which the second opposite-surface electrode layer 22 has a maximum thickness. Preferably, this condition is satisfied at least in a cross-sectional view along a central line of the laminated ceramic electronic component 100 (a line passing through a center of the laminated ceramic electronic component 100 in the width direction DY along the length direction DX) as indicated by the line IV-IV in FIG. 3. More preferably, this condition is also further satisfied in another cross-sectional view, for example, in a cross-sectional view along each of two lines separated from the central line described above by approximately a quarter of a maximum size of the laminated ceramic electronic component 100 in the width direction DY. A thickness of the second opposite-surface electrode layer 22 has a size along the lamination direction DZ.

Preferably, in the cross-sectional view (FIG. 4) including the lamination direction DZ and the length direction DX, a position XM1 in which the first mounting-surface electrode layer 31 has a maximum thickness is shifted toward the first side surface PS1 in the length direction DX with respect to a position XO1 in which the first opposite-surface electrode layer 21 has a maximum thickness. Preferably, this condition is satisfied at least in the cross-sectional view along the central line of the laminated ceramic electronic component 100 as indicated by the line IV-IV in FIG. 3. More preferably, this condition is also further satisfied in another cross-sectional view, for example, in the cross-sectional view along each of two lines separated from the central line described above by approximately the quarter of the maximum size of the laminated ceramic electronic component 100 in the width direction DY. A thickness of the first opposite-surface electrode layer 21 has a size along the lamination direction DZ.

The size of the shift of the position XM2 from the position XO2 is preferably equal to or larger than five percent of a maximum length of the laminated ceramic electronic component 100 (a maximum size in the length direction DX). The same applies to the size of the shift of the position XM1 from the position XO1.

The second mounting-surface electrode layer 32 preferably has a step-like shape on the mounting surface PM. Herein, "the step-like shape" indicates a shape of a portion, with approximately a constant thickness, disposed between a position D2a in which the thickness of the second mounting-surface electrode layer 32 (the size in the lamination direction DZ) decreases from the position XM2 toward an inner side (the center in FIG. 4) and a position D2b in which the thickness of the second mounting-surface electrode layer 32 decreases to zero.

The first mounting-surface electrode layer 31 preferably has a step-like shape on the mounting surface PM. Herein, "the step-like shape" indicates a shape of a portion, with approximately a constant thickness, disposed between a position D1a in which the thickness of the first mounting-surface electrode layer 31 (the size in the lamination direction DZ) decreases from the position XM1 toward an inner side (the center in FIG. 4) and a position D1b in which the thickness of the first mounting-surface electrode layer 31 decreases to zero.

Each thickness of the first side-surface electrode layer 11 and the second side-surface electrode layer 12 preferably increases from the opposite surface PO toward the mounting surface PM. Each thickness of the first side-surface electrode layer 11 and the second side-surface electrode layer 12 has a size along the length direction DX.

The laminated body 91 has a structure that a plurality of dielectric ceramic layers 40 and at least one inner electrode layer 50 are laminated on each other alternately. The dielectric ceramic layer 40 includes an opposite-side dielectric ceramic layer 41, a middle dielectric ceramic layer 42, and a mounting-side dielectric ceramic layer 43 in the present embodiment. The inner electrode layer 50 includes an opposite side inner electrode layer 51 and a mounting-side inner electrode layer 52 in the present embodiment.

The opposite-side dielectric ceramic layer 41 is in contact with the first opposite-surface electrode layer 21 and the second opposite-surface electrode layer 22. The mounting-side dielectric ceramic layer 43 is in contact with the first mounting-surface electrode layer 31 and the second mounting-surface electrode layer 32. The middle dielectric ceramic layer 42 is disposed between the opposite-side dielectric ceramic layer 41 and the mounting-side dielectric ceramic layer 43. The opposite-side dielectric ceramic layer 41 has an opposite-side surface SO (FIG. 5) facing the opposite surface PO (FIG. 4) of the laminated ceramic electronic component 100. The mounting-side dielectric ceramic layer 43 has a mounting-side surface SM (FIG. 5) facing the mounting surface PM (FIG. 4) of the laminated ceramic electronic component 100. The laminated body 91 has a first side surface SS1 (FIG. 5) connecting the opposite-side surface SO and the mounting-side surface SM and a second side surface SS2 (FIG. 5) located opposite to the first side surface SS1 in the length direction DX to connect the opposite-side surface SO and the mounting-side surface SM.

The opposite side inner electrode layer 51 is separated from the first opposite-surface electrode layer 21 and the second opposite-surface electrode layer 22 by the opposite-side dielectric ceramic layer 41, and is disposed on the opposite-side dielectric ceramic layer 41. The opposite side inner electrode layer 51 extends from the second side-surface electrode layer 12, and is separated from the first side-surface electrode layer 11. The mounting-side inner electrode layer 52 is separated from the first mounting-surface electrode layer 31 and the second mounting-surface electrode layer 32 by the mounting-side dielectric ceramic layer 43, and is disposed on the mounting-side dielectric ceramic layer 43. The mounting-side inner electrode layer 52 extends from the first side-surface electrode layer 11, and is separated from the second side-surface electrode layer 12.

In the present embodiment, one middle dielectric ceramic layer 42 is provided, however, a plurality of middle dielectric ceramic layers 42 may be provided instead. In that case, an inner electrode layer may be provided between the middle dielectric ceramic layers 42.

A distance TD (FIG. 3) from the longitudinal surface PL to the mounting-side inner electrode layer 52 may be smaller than a thickness of the mounting-side dielectric ceramic layer 43 (FIG. 4), and may be zero. When the distance TD is small as described above, a range of the displacement of the laminated ceramic electronic component 100 as the actuator element can be further increased. When the distance TD is larger than zero, a portion in the laminated body 91 corresponding to the distance TD is made of an insulator. However, this portion only has a thin thickness corresponding to the distance TD, so that a sufficient insulation property cannot necessarily be ensured by this portion. Thus, if the second junction part 302 (FIG. 1) excessively expands on the longitudinal surface PL, an undesirable short circuit occurs between the second junction part 302 and the mounting-side inner electrode layer 52 in the longitudinal surface PL. According to the present embodiment, an occurrence of this short circuit can be avoided for a reason described hereinafter.

A length of the laminated ceramic electronic component 100 (a size in the length direction DX) is preferably equal to or larger than 0.4 mm and equal to or smaller than 1.5 mm, and is approximately 0.7 mm, for example. A width of the laminated ceramic electronic component 100 (a size in the width direction DY) is preferably equal to or larger than 0.15 mm and equal to or smaller than 0.5 mm, and is approximately 0.3 mm, for example. A thickness of the laminated ceramic electronic component 100 (a size the lamination direction DZ) is preferably equal to or larger than 0.03 mm and equal to or smaller than 0.07 mm, and is approximately 0.065 mm, for example.

(Method of Manufacturing Laminated Ceramic Electronic Component)

First to third examples are described below as a method of manufacturing the laminated ceramic electronic component 100 (FIG. 4).

(1) First Example

A green sheet which is to be the dielectric ceramic layer 40 is prepared. An electrode paste pattern which is to be the inner electrode layer 50 is formed on the green sheet. Next, the green sheet is sequentially laminated to form a laminated body sheet.

The electrode paste pattern is formed on an upper surface (corresponding to the opposite-side surface SO) and a lower surface (corresponding to the mounting-side surface SM) of the laminated body sheet. The electrode paste pattern is to correspond to part of the first opposite-surface electrode layer 21, the second opposite-surface electrode layer 22, the first mounting-surface electrode layer 31, and the second mounting-surface electrode layer 32. The electrode paste pattern needs not have a maximum thickness in the position XO1, the position XO2, the position XM1, and the position XM2 at this time.

Next, a fired body sheet is formed by firing the laminated body sheet. Next, the first side surface SS1 and the second side surface SS2 (FIG. 5) are formed by cutting the fired body sheet.

Next, an electrode including part corresponding to the first side-surface electrode layer 11 and the second side-surface electrode layer 12 is added. A range where this step is performed extends not only onto the first side surface SS1 and the second side surface SS2 but also onto an end of the opposite-side surface SO and an end of the mounting-side surface SM. Thus, the added electrode also corresponds to part of the first opposite-surface electrode layer 21, the second opposite-surface electrode layer 22, the first mounting-surface electrode layer 31, and the second mounting-surface electrode layer 32. This step is performed so that the first opposite-surface electrode layer 21 has the maximum thickness in the position XO1, the second opposite-surface electrode layer 22 has the maximum thickness in the position XO2, the first mounting-surface electrode layer 31 has the maximum thickness in the position XM1, and the second mounting-surface electrode layer 32 has the maximum thickness in the position XM2.

Next, the longitudinal surface PL (FIG. 3) is formed by cutting the fired body sheet. Chips corresponding to each of the laminated ceramic electronic component 100 are formed from the fired body sheet by the cutting processing. Polarization processing is performed on each chip. The laminated ceramic electronic component 100 is thereby obtained.

(2) Second Example

A green sheet which is to be the dielectric ceramic layer 40 is prepared. An electrode paste pattern which is to be the inner electrode layer 50 is formed on the green sheet. Next, the green sheet is sequentially laminated to form a laminated body sheet.

The electrode paste pattern is formed on an upper surface (corresponding to the opposite-side surface SO) and a lower surface (corresponding to the mounting-side surface SM) of the laminated body sheet. The electrode paste pattern is to correspond to part of the first opposite-surface electrode layer 21, the second opposite-surface electrode layer 22, the first mounting-surface electrode layer 31, and the second mounting-surface electrode layer 32. The electrode paste pattern needs not have a maximum thickness in the position XO1, the position XO2, the position XM1, and the position XM2 at this time. Next, the first side surface SS1 and the second side surface SS2 (FIG. 5) are formed by cutting the laminated body sheet.

Next, an electrode paste layer including part corresponding to the first side-surface electrode layer 11 and the second side-surface electrode layer 12 is formed. A range where the electrode paste layer is formed extends not only onto the first side surface SS1 and the second side surface SS2 but also onto an end of the opposite-side surface SO and an end of the mounting-side surface SM. Thus, the electrode paste layer also corresponds to part of the first opposite-surface electrode layer 21, the second opposite-surface electrode layer 22, the first mounting-surface electrode layer 31, and the second mounting-surface electrode layer 32. The electrode paste layer is formed so that the first opposite-surface electrode layer 21 has the maximum thickness in the position XO1, the second opposite-surface electrode layer 22 has the maximum thickness in the position XO2, the first mounting-surface electrode layer 31 has the maximum thickness in the position XM1, and the second mounting-surface electrode layer 32 has the maximum thickness in the position XM2.

Specifically, an electrode paste having viscosity is applied by a screen printing, thus performed are steps of flowing the electrode paste down each of the first side surface SS1 and the second side surface SS2 from the opposite-side surface SO and flowing the electrode paste down each of the first side surface SS1 and the second side surface SS2 from the mounting-side surface SM. The position XO1, the position XO2, the position XM1, and the position XM2 can be controlled by adjusting a range of an opening of a screen used in the screen printing and the viscosity of the electrode paste.

Next, the longitudinal surface PL (FIG. 3) is formed by cutting the laminated body sheet. Chips corresponding to each of the laminated ceramic electronic component 100 are formed from the laminated body sheet by the cutting processing. Next, these chips are fired. Next, polarization processing is performed on each chip. The laminated ceramic electronic component 100 is thereby obtained.

(3) Third Example

A green sheet which is to be the dielectric ceramic layer 40 is prepared. An electrode paste pattern which is to be the inner electrode layer 50 is formed on the green sheet. Next, the green sheet is sequentially laminated to form a laminated body sheet.

The electrode paste pattern is formed on an upper surface (corresponding to the opposite-side surface SO) and a lower surface (corresponding to the mounting-side surface SM) of the laminated body sheet. The electrode paste pattern is to correspond to part of the first opposite-surface electrode layer 21, the second opposite-surface electrode layer 22, the first mounting-surface electrode layer 31, and the second mounting-surface electrode layer 32. The electrode paste pattern needs not have a maximum thickness in the position XO1, the position XO2, the position XM1, and the position XM2 at this time.

Next, the first side surface SS1, the second side surface SS2 (FIG. 5), and the longitudinal surface PL (FIG. 3) are formed by cutting the laminated body sheet. Chips corresponding to each of the laminated ceramic electronic component 100 are formed from the laminated body sheet by the cutting processing. Next, these chips are fired.

Next, an electrode including part corresponding to the first side-surface electrode layer 11 and the second side-surface electrode layer 12 is added. A range where this step is performed extends not only onto the first side surface SS1 and the second side surface SS2 but also onto an end of the opposite-side surface SO and an end of the mounting-side surface SM. Thus, the added electrode also corresponds to part of the first opposite-surface electrode layer 21, the second opposite-surface electrode layer 22, the first mounting-surface electrode layer 31, and the second mounting-surface electrode layer 32. This step is performed so that the first opposite-surface electrode layer 21 has the maximum thickness in the position XO1, the second opposite-surface electrode layer 22 has the maximum thickness in the position XO2, the first mounting-surface electrode layer 31 has the maximum thickness in the position XM1, and the second mounting-surface electrode layer 32 has the maximum thickness in the position XM2.

Next, polarization processing is performed on each chip. The laminated ceramic electronic component 100 is thereby obtained.

(Method of Manufacturing Electronic Component Assembly)

Figure 6:
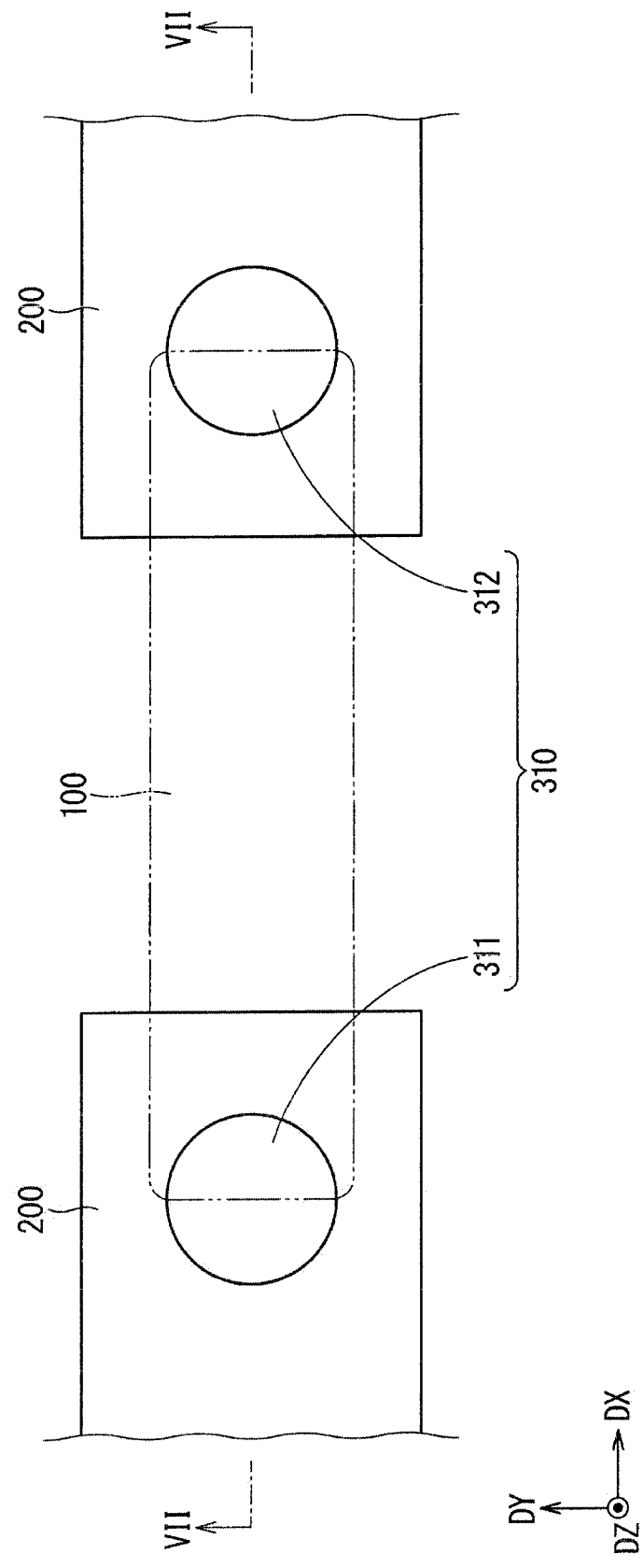
FIG. 6 is a top view schematically illustrating a first step of manufacturing the electronic component assembly in the embodiment 1 of the present invention.
Figure 7:
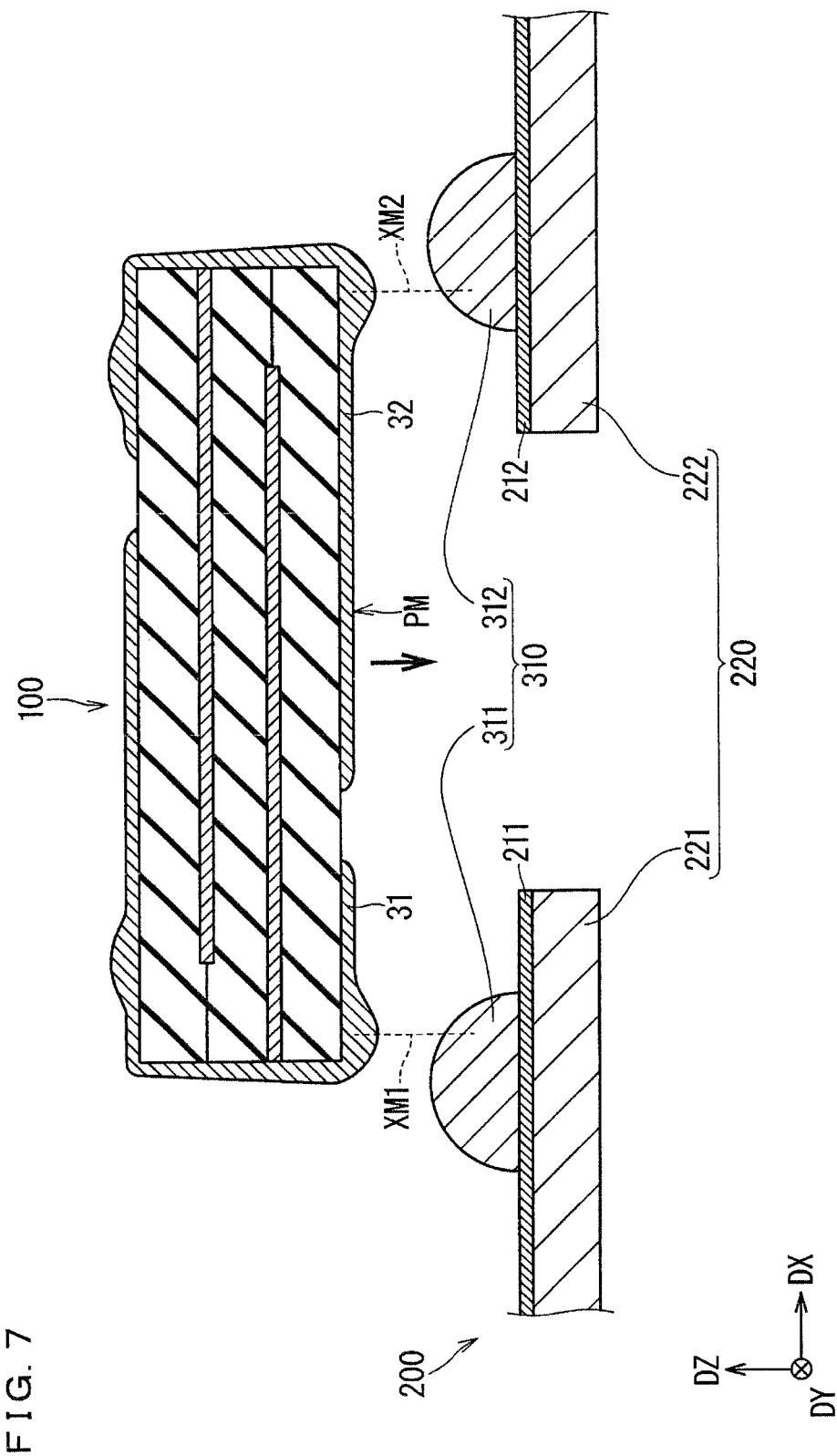
FIG. 7 is a schematic cross-sectional view along a line VII-VII in FIG. 6.

FIG. 6 is a top view schematically illustrating a first step of manufacturing the electronic component assembly 500, and FIG. 7 is a schematic cross-sectional view along a line VII-VII in FIG. 6. A conductive paste 310 is applied on the mounted member 200. Specifically, a first conductive paste part 311 and a second conductive paste part 312 of the conductive paste 310 are formed on the first conductive part 211 and the second conductive part 212 of the mounted member 200, respectively. Next, the mounting surface PM of the laminated ceramic electronic component 100 is disposed on the conductive paste 310 as indicated by an arrow in FIG. 7.

Figure 8:
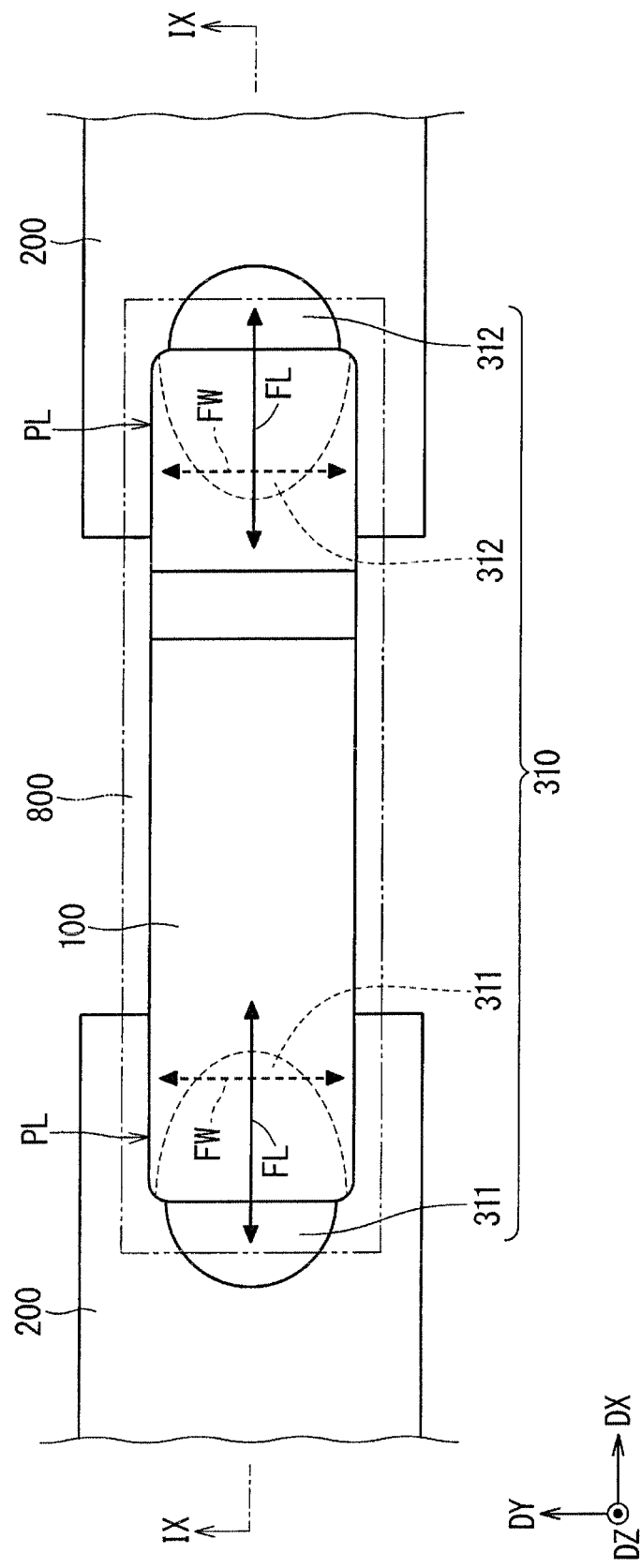
FIG. 8 is a top view schematically illustrating a second step of manufacturing the electronic component assembly in the embodiment 1 of the present invention.
Figure 9:
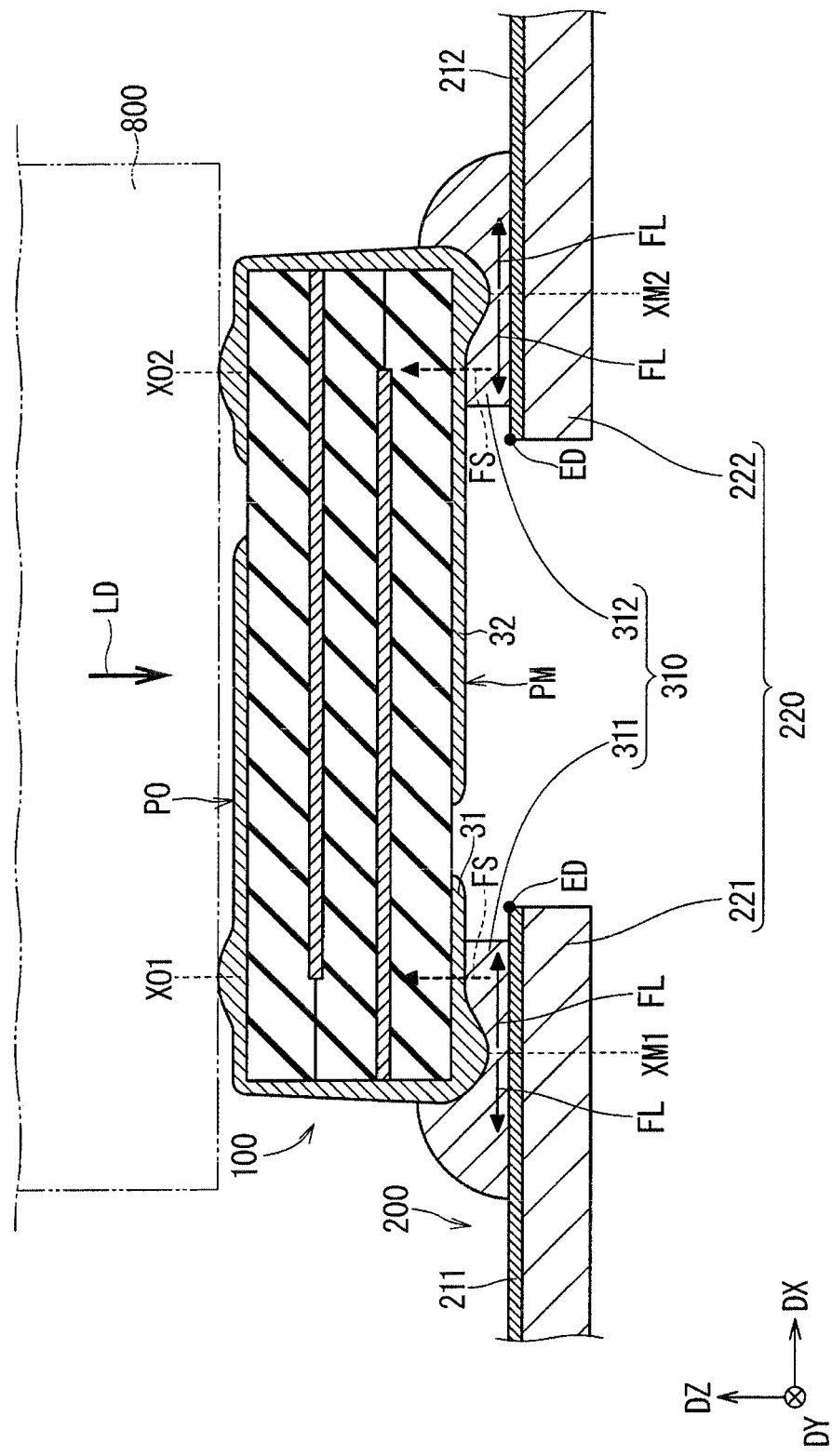
FIG. 9 is a schematic cross-sectional view along a line IX-IX in FIG. 8.

FIG. 8 is a top view schematically illustrating a second step of manufacturing the electronic component assembly 500, and FIG. 9 is a schematic cross-sectional view along a line IX-IX in FIG. 8. A load LD is applied to the opposite surface PO of the laminated ceramic electronic component 100 by a load applying part 800 of a mounting device. The mounting surface PM of the laminated ceramic electronic component 100 is thereby pressed on the conductive paste 310. The load LD tends to be concentrated on the positions XO1 and XO2 in the opposite surface PO, and tends to be concentrated on the positions XM1 and XM2 in the mounting surface PM. According to a study of the present inventor, when a relative relationship of these positions are selected as described above, a flow of the conductive paste 310 below the mounting surface PM tends to move along the length direction DX. Specifically, a flow FL moving along the length direction DX is facilitated compared to a flow FW moving along the width direction DY. In other words, the flow FW moving along the width direction DY is suppressed compared to the flow FL moving along the length direction DX. As a result, an amount of the conductive paste 310 flowing out toward the longitudinal surface PL (FIG. 8) of the laminated ceramic electronic component is suppressed. Thus, a rise of the conductive paste 310 on the longitudinal surface PL along the lamination direction DZ is suppressed.

Next, the conductive paste 310 is cured by thermal processing. The first junction part 301 and the second junction part 302 are thereby formed from the first conductive paste part 311 and the second conductive paste part 312, respectively.

The electronic component assembly 500 (FIG. 1 and FIG. 2) is obtained in the manner described above.

(Effect)

According to the laminated ceramic electronic component 100 of the present embodiment, in the cross-sectional view (FIG. 4) including the lamination direction DZ and the length direction DX, the position XM2 in which the second mounting-surface electrode layer 32 has the maximum thickness is shifted toward the second side surface PS2 in the length direction DX with respect to the position XO2 in which the second opposite-surface electrode layer 22 has the maximum thickness. In this case, according to the study of the present inventor, as illustrated in FIG. 9, when the mounting surface PM of the laminated ceramic electronic component 100 is pressed on the conductive paste 310 by applying the load LD to the opposite surface PO for mounting the laminated ceramic electronic component 100, the flow of the conductive paste 310 below the mounting surface PM tends to move along the length direction DX. As a result, the excessive rise of the conductive paste 310 along the lamination direction DZ is avoided on the longitudinal surface PL (FIG. 8). Avoided thereby is the excessive decrease in the distance from the conductive paste 310 on the longitudinal surface PL to the inner electrode. Thus, avoided is the excessive decrease in the distance from the conductive member 300 made from the conductive paste 310 to the inner electrode. As described above, in the case where the laminated ceramic electronic component 100 is mounted using the conductive paste 310, high insulation reliability can be ensured.

From a viewpoint of the designing of the laminated ceramic electronic component 100, the mounting-side inner electrode layer 52 needs to be electrically connected to the first side-surface electrode layer 11, and also needs to be electrically insulated from the second side-surface electrode layer 12. There is hardly bad influence even if the first conductive paste part 311 being in contact with the first mounting-surface electrode layer 31 gets close to the mounting-side inner electrode layer 52, however, the state where the second conductive paste 312 being in contact with the second mounting-surface electrode layer 32 gets close to the mounting-side inner electrode layer 52 leads to the decrease in the insulation reliability. According to the present embodiment, the decrease in the insulation reliability can be efficiently suppressed.

When the distance TD (FIG. 3) from the longitudinal surface PL to the mounting-side inner electrode layer 52 is smaller than the thickness of the mounting-side dielectric ceramic layer 43 (FIG. 4), the distance from the conductive paste 310 to the mounting-side inner electrode layer 52 may be smaller than the thickness of the mounting-side dielectric ceramic layer 43 due to the rise of the conductive paste 310 on the longitudinal surface PL along the lamination direction DZ. This leads to the decrease in the insulation reliability. According to the present embodiment, the decrease in the insulation reliability can be efficiently suppressed.

In the cross-sectional view (FIG. 4) including the lamination direction DZ and the length direction DX, the position XM1 in which the first mounting-surface electrode layer 31 has the maximum thickness is shifted toward the first side surface PS1 in the length direction DX with respect to the position XO1 in which the first opposite-surface electrode layer 21 has the maximum thickness. As described above, there is hardly bad influence even if the first conductive paste part 311 being in contact with the first mounting-surface electrode layer 31 gets close to the mounting-side inner electrode layer 52. However, the state where the first conductive paste part 311 further gets close to the opposite side inner electrode layer 51 (more generally, the other inner electrode layer adjacent to the mounting-side inner electrode layer 52) leads to the decrease in the insulation reliability. According to the present embodiment, the decrease in the insulation reliability can also be suppressed.

Working Example

As shown by a table described below, laminated ceramic electronic components according to working examples 1 and 2 and a comparison example were manufactured.

TABLE 1

| Sample | Positional shift | Step-like shape | Insulation deterioration time |
|---|---|---|---|
| Comparison example | Absence | Absence | 270 hours |
| Working example 1 | Presence | Absence | 761 hours |
| Working example 2 | Presence | Presence | 1091 hours |

In each of the working examples 1 and 2, the laminated ceramic electronic component was manufactured so that the position XM2 is shifted toward the second side surface PS2 with respect to the position XO2 and the position XM1 is shifted toward the first side surface PS1 with respect to the position XO1. In the comparison example, the laminated ceramic electronic component was manufactured so that such a positional shift does not occur. In the working example 2, each of the first mounting-surface electrode layer 31 and the second mounting-surface electrode layer 32 is provided with the step-like shape described above. In the working example 1 and the comparison example, such a step-like shape was not provided. An insulation deterioration time was measured using a condition of temperature 85° C., humidity 75%, and voltage 50 V for these samples. The insulation deterioration time increased in the case where the shift described above was provided, and further increased in the case where the step-like shape descried above was provided.

Modification Example

Figure 10:
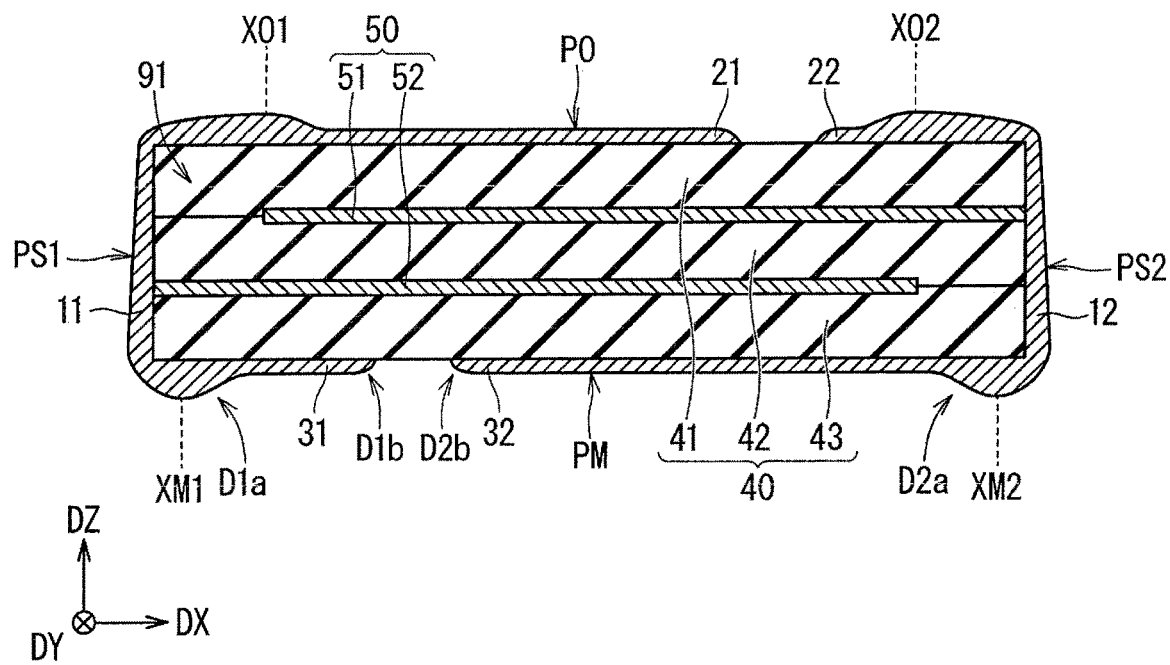
FIG. 10 is a schematic cross-sectional view illustrating a modification example in FIG. 4.

In the laminated ceramic electronic component 100 (FIG. 4), each of the first opposite-surface electrode layer 21 and the second opposite-surface electrode layer 22 has a flat surface on an outer end. In contrast, in a laminated ceramic electronic component 101 (FIG. 10) according to the present modification example, each of the first opposite-surface electrode layer 21 and the second opposite-surface electrode layer 22 does not have such a flat surface but has a thickness gradually decreasing on an outer end. The effect similar to that of the present embodiment described above can be obtained by the present modification example.

Embodiment 2

(Configuration)

Figure 11:
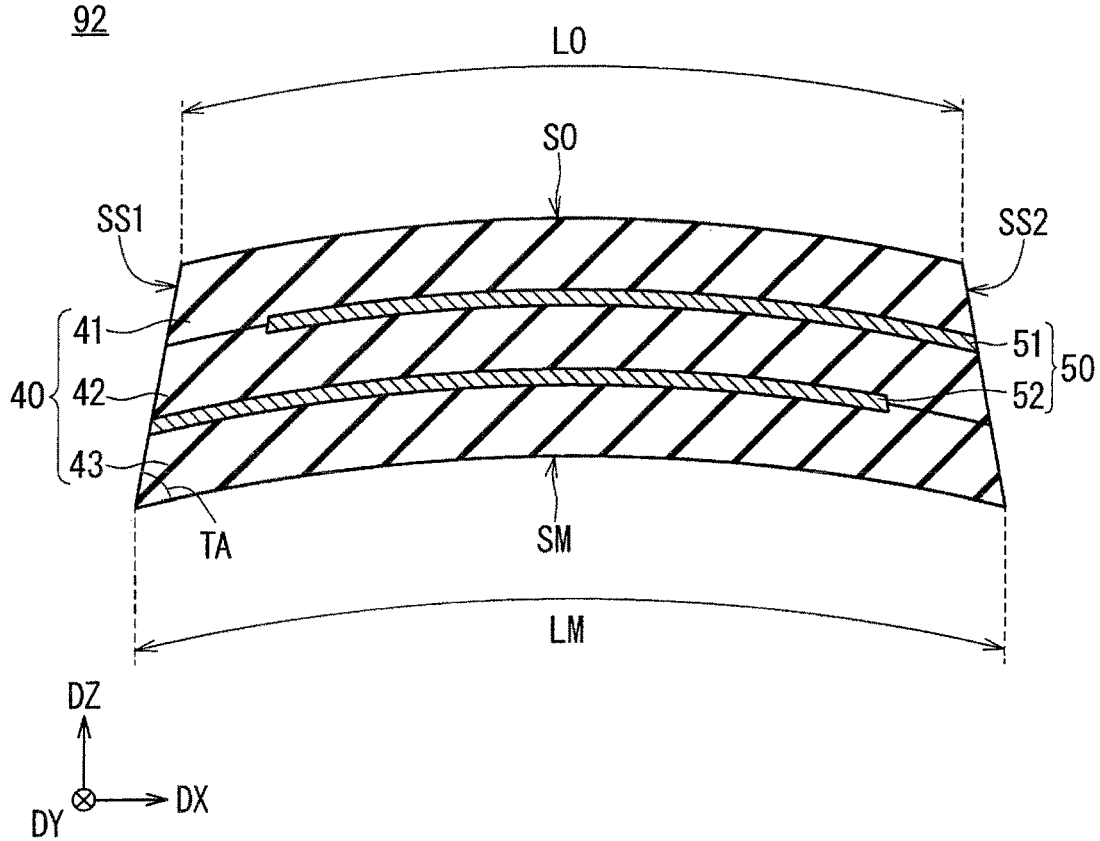
FIG. 11 is a cross-sectional view schematically illustrating a configuration of a laminated body included in a laminated ceramic electronic component in the embodiment 2 of the present invention.

FIG. 11 is a cross-sectional view schematically illustrating a configuration of a laminated body 92 included in a laminated ceramic electronic component in a present embodiment 2. In the present embodiment 2, the laminated body 92 is used in place of the laminated body 91 (FIG. 5) in the electronic component assembly (FIG. 2) and the laminated ceramic electronic component 100 (FIG. 4) described in the embodiment 1.

The mounting-side surface SM of the laminated body 92 has a concave shape in a surface profile along the length direction DX. The surface profile may be measured along the central line of the laminated ceramic electronic component 100, for example.

The mounting-side surface SM is preferably larger than the opposite-side surface SO in the cross-sectional view (FIG. 11) including the lamination direction DZ and the length direction DX. In other words, in FIG. 11, a size LM of the mounting-side surface SM is preferably larger than a size LO of the opposite-side surface SO. The size LM is a size measured along the mounting-side surface SM having the concave shape, and the size LO is a size measured along the opposite-side surface SO having a convex shape.

The mounting-side surface SM and the first side surface SS1 form an angle TA with each other. The angle TA is preferably smaller than 90°. In other words, the laminated body 92 preferably has a taper shape from the mounting-side surface SM toward the opposite-side surface SO. The same applies to the second side surface SS2.

The laminated body 92 is obtained by firing a green chip. The green chip is obtained by being cut out of a laminated sheet having the plurality of green sheets laminated on each other. The green chip can be cut out by sliding a cutter. Each green sheet of the laminated sheet does not have the same density but has a different density from each other, thereby being able to provide the laminated body 92 of a warpage caused by a difference of shrinkage in the firing. The concave shape described above can be obtained by this warpage. The angle TA can be adjusted by adjusting an angle which a cutting edge of the cutter has.

(Effect)

The laminated ceramic electronic component 100 is elastically deformed by the load LD (FIG. 9) applied in the mounting. According to the present embodiment, the mounting surface PM also has a shape close to a concave shape corresponding to the concave shape of the mounting-side surface SM (FIG. 11). Avoided accordingly is a collision of the mounting surface PM with a corner ED (FIG. 9) of the mounted member 200 caused by the elastic deformation. Thus, a damage on the laminated ceramic electronic component 100 caused by the collision can be avoided. Thus, a breakage of the laminated ceramic electronic component 100 caused by the collision described above can be avoided.

Particularly, when the space 223 (FIG. 2) is provided, the laminated ceramic electronic component 100 tends to be locally pressed on the corner ED (FIG. 9), thus it is important to avoid the collision as described above. In FIG. 9, the corner ED corresponds to an edge of each of the first conductive part and the second conductive part, however, the corner ED may correspond to an edge of each of the first support part 221 and the second support part 222.

When the position XM2 is shifted toward the second side surface PS2 with respect to the position XO2 (FIG. 4), the mounting surface PM is supported in the position XM2 which is relatively located on an outer side, and the load LD is applied to the opposite surface PO in the position XO2 which is relatively located on an inner side. In this case, a deformation of bringing the mounting surface PM close to the corner ED easily occurs. According to the present embodiment, such a deformation can be efficiently suppressed.

Although there is normally a limitation on the maximum length of the laminated ceramic electronic component 100, the mounting-side surface SM is larger than the opposite-side surface SO in the length direction DX, thus the length of the mounting-side surface SM can be greatly ensured. The load LD applied to the laminated ceramic electronic component 100 in the mounting is thereby diffused to a larger range. Thus, the occurrence of the breakage of the laminated ceramic electronic component 100 in the mounting can be suppressed.

Working Example

Samples M1 to M6 and samples O1 to O4 which are laminated ceramic electronic components are manufactured as shown in a table described below.

TABLE 2

| Sample | Location of concave shape | Difference of length | Angle | Breakage in mounting | Chippage in handling | |
|---|---|---|---|---|---|---|
| M1 | Mounting side | 0 μm | 90° | 0.20% | Middle | 0.10% | Low |
| O1 | Opposite side | 0 μm | 90° | 0.50% | High | 0.10% | Low |

TABLE 2-continued

| Sample | Location of concave shape | Difference of length | Angle | Breakage in mounting | Chippage in handling | |
|---|---|---|---|---|---|---|
| M2 | Mounting side | +1 μm | 89° | 0.01% | Low | 0.10% | Low |
| O2 | Opposite side | −1 μm | 91° | 0.40% | High | No data | — |
| M3 | Mounting side | +4 μm | 85° | 0.02% | Low | 0.10% | Low |
| O3 | Opposite side | −4 μm | 95° | 0.06% | High | No data | — |
| M4 | Mounting side | +9 μm | 80° | 0.01% | Low | 0.00% | Low |
| O4 | Opposite side | −9 μm | 100° | 0.30% | Middle | No data | — |
| M5 | Mounting side | +15 μm | 73° | 0.00% | Low | 0.30% | Middle |
| M6 | Mounting side | +20 μm | 68° | 0.02% | Low | 0.80% | High |

In the samples M1 to M6, the concave shape formed by the warpage is located in the mounting-side surface SM (FIG. 11). In the samples O1 to O4, the concave shape formed by the warpage is located in the opposite-side surface SO (FIG. 11). In Table 2, "difference of length" indicates a value obtained by subtracting the size LO (FIG. 11) from the size LM (FIG. 11), and "angle" is the angle TA (FIG. 11). "Difference of length" and "angle" were adjusted by changing the angle which the cutting edge of the cutter has as described above.

Examined was a probability of the occurrence of the breakage of the obtained laminated ceramic electronic component at the time of being mounted on the mounted member. As a result, it was suggested by a comparison between the samples which have the same absolute value of the difference of the length (a comparison between the samples M1 and O1, a comparison between the samples M2 and O2, a comparison between the samples M3 and O3, and a comparison between the samples M4 and O4) that in a case where the size of the laminated ceramic electronic component was the same, the probability of the breakage of the laminated ceramic electronic component in the mounting can be suppressed by locating the concave shape in the mounting-side surface SM. The samples M2 to M6 in the samples M1 to M6 in which the concave shape was located in the mounting-side surface SM particularly had a low probability equal to or smaller than 0.02%.

Also examined was a probability of an occurrence of a chippage of the laminated ceramic electronic component before the mounting of the laminated ceramic electronic component was completed. As a result, the probability of the samples M1 to M4 having the difference of the length of +9 μm or smaller in the samples M1 to M6 was equal to or smaller than 0.10%. Suggested thereby was that the samples M2 to M4 were particularly preferable to prevent not only the breakage in the mounting but also the chippage in the manufacturing steps.

Embodiment 3

Figure 12:
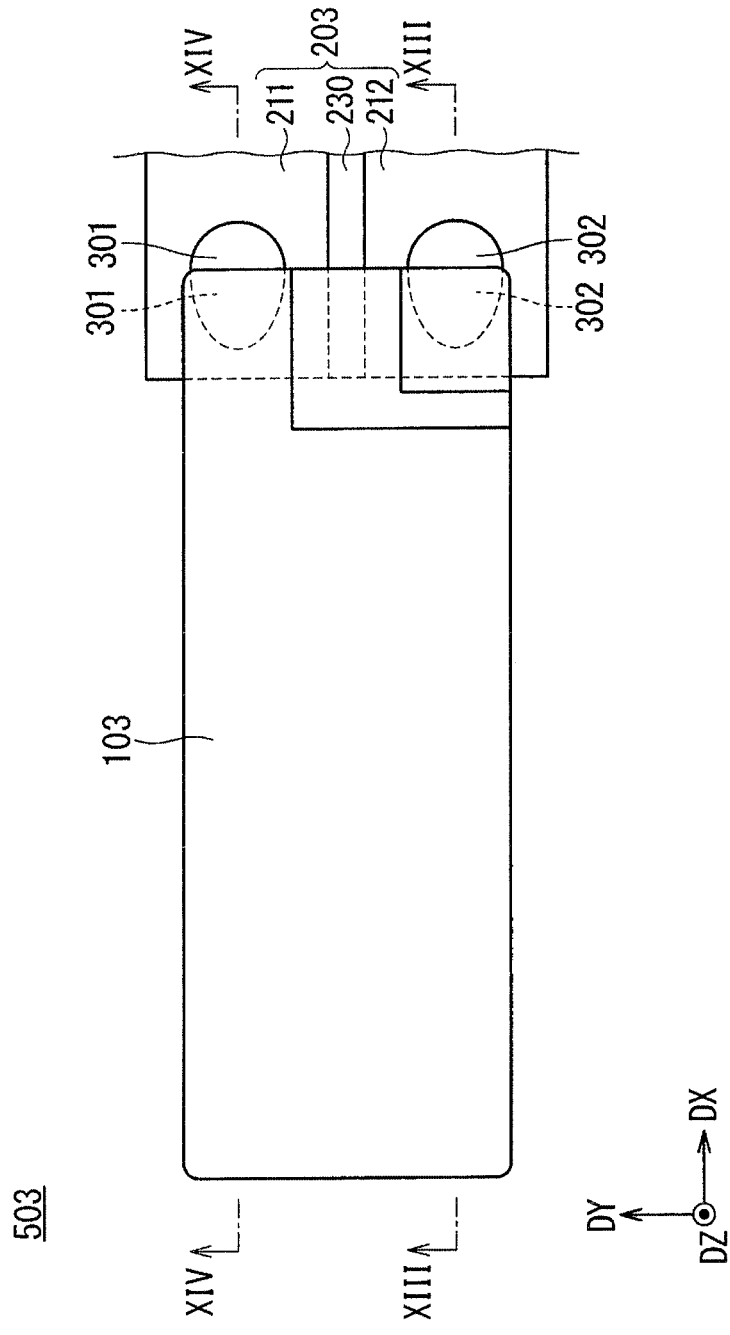
FIG. 12 is a top view schematically illustrating a configuration of an electronic component assembly in an embodiment 3 of the present invention.
Figure 13:
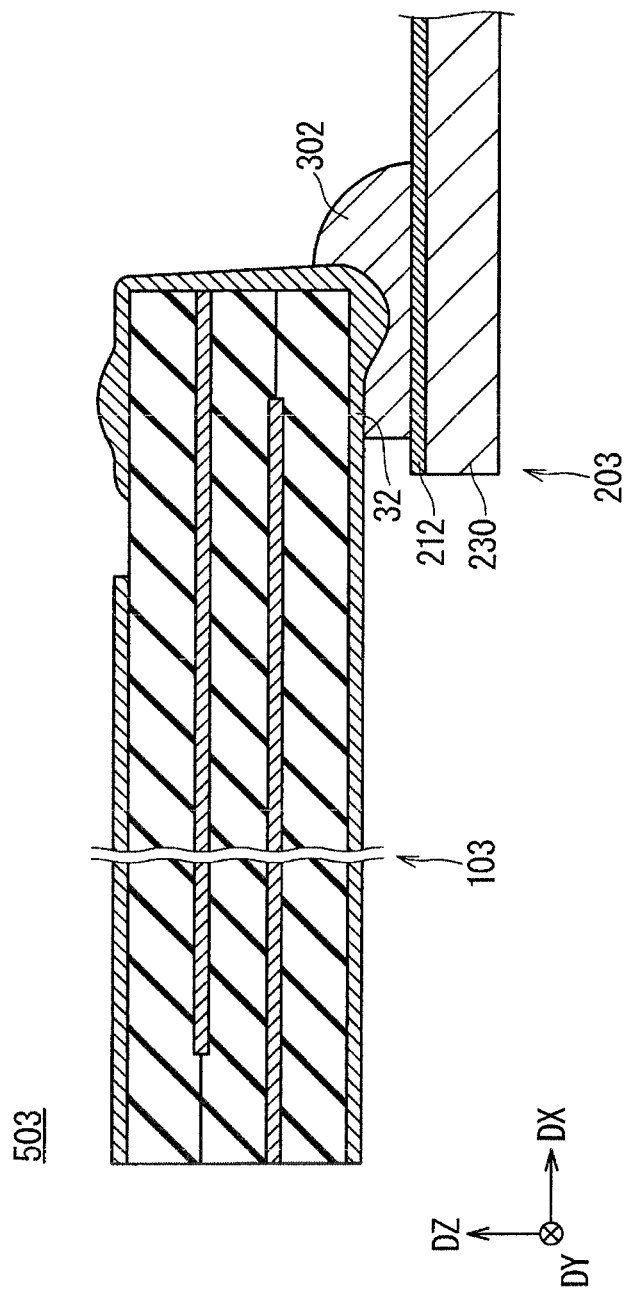
FIG. 13 is a schematic cross-sectional view along a line XIII-XIII in FIG. 12.
Figure 14:
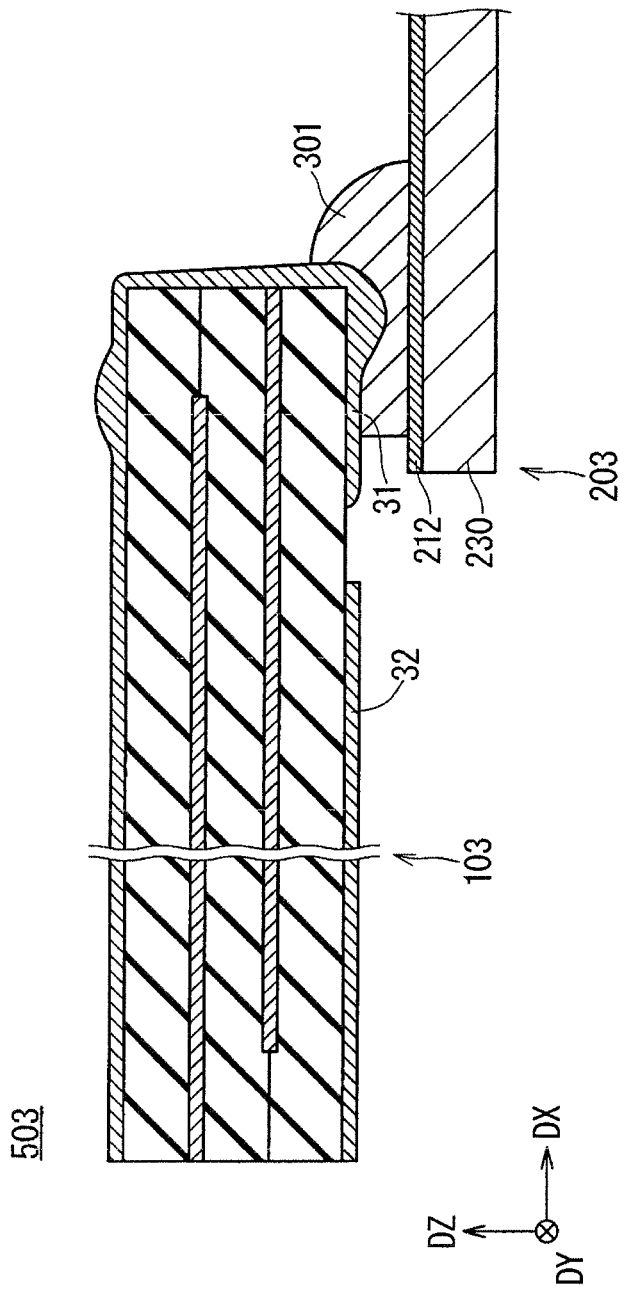
FIG. 14 is a schematic cross-sectional view along a line XIV-XIV in FIG. 12.

FIG. 12 is a top view schematically illustrating a configuration of an electronic component assembly 503 in a present embodiment 3. Each of FIG. 13 and FIG. 14 is a schematic cross-sectional view along a line XIII-XIII and a line XIV-XIV in FIG. 12.

The electronic component assembly 503 has a laminated ceramic electronic component 103, a mounted member 203, and a conductive member (a first junction part 301 and a second junction part 302). The laminated ceramic electronic component 103 is an actuator element to generate displacement in the length direction DX. A curved displacement may be generated by making the displacement in the length direction DX uneven in the lamination direction DZ. The laminated ceramic electronic component 103 may be used as a cantilever actuator element when only one end thereof in the length direction DX is supported as illustrated in FIG. 12. The electronic component assembly 503 may be used as a switching element when the electronic component assembly 503 is further provided with an electrical contact point (not shown).

The mounted member 203 has a first conductive part 211 and a second conductive part 212 separated from each other. The mounted member 203 has a support 230. The support 230 supports the first conductive part 211 and the second conductive part 212.

Figure 15:
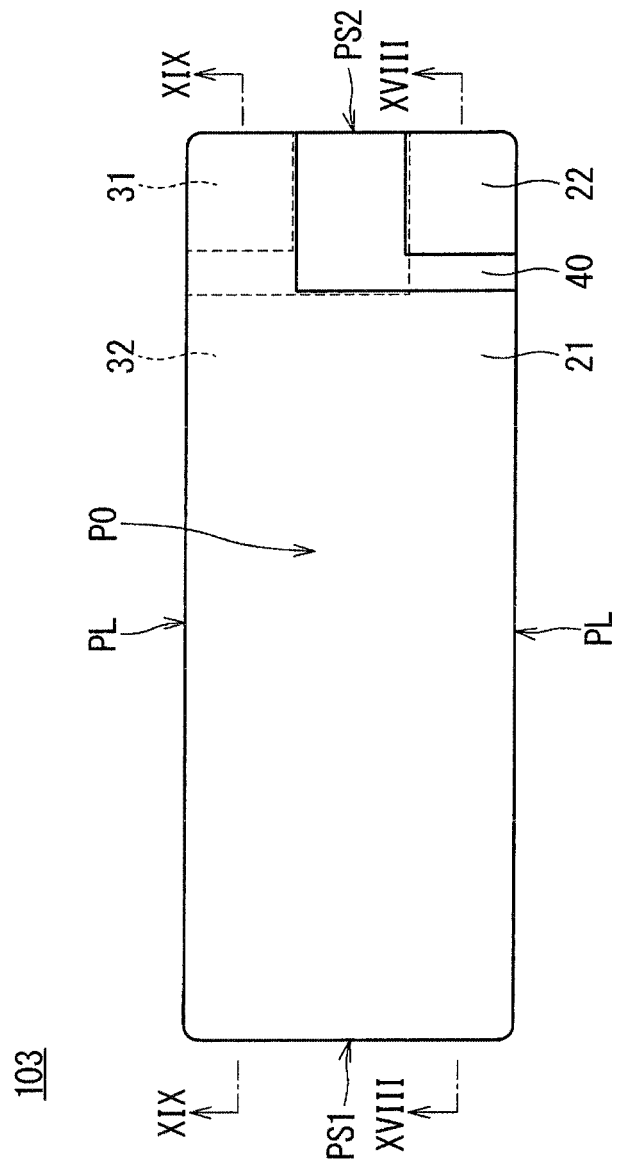
FIG. 15 is a top view schematically illustrating a configuration of a laminated ceramic electronic component in the embodiment 3 of the present invention, and is a view illustrating a layout of first and second mounting-surface electrode layers by a broken line.
Figure 16:
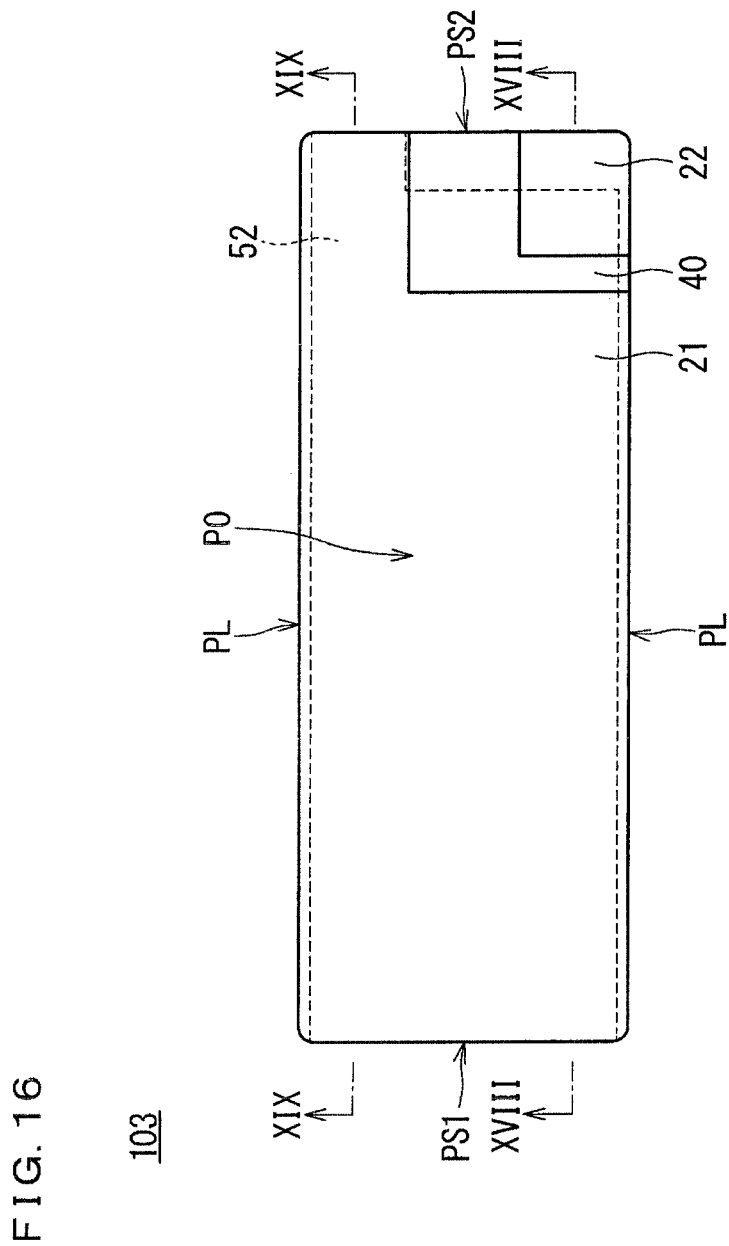
FIG. 16 is a top view schematically illustrating a configuration of a laminated ceramic electronic component in the embodiment 3 of the present invention, and is a view illustrating a layout of a mounting-side inner electrode layer connected to a first side-surface electrode layer by a broken line.
Figure 17:
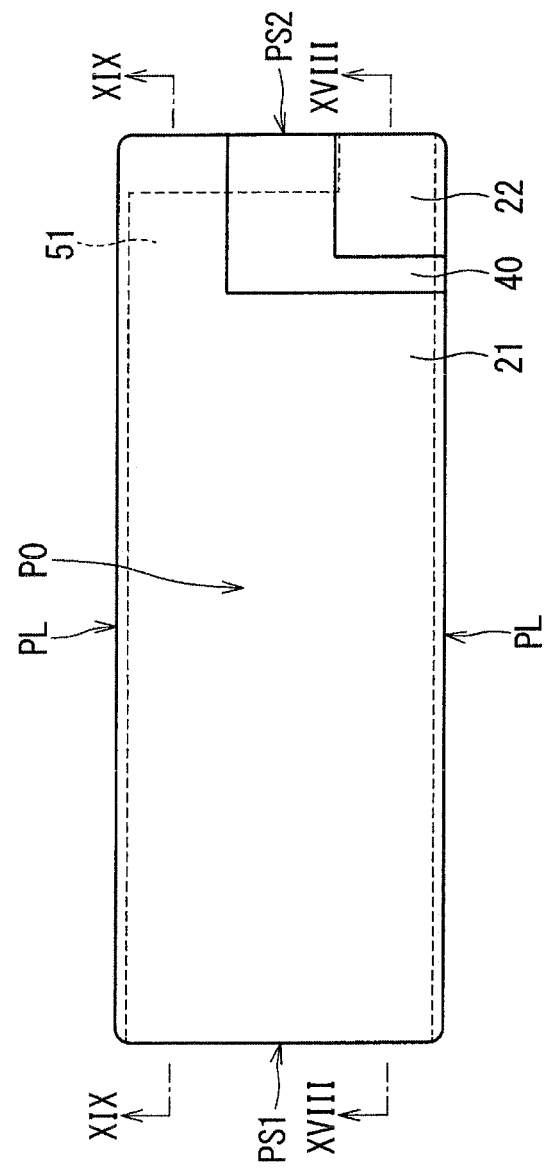
FIG. 17 is a top view schematically illustrating a configuration of the laminated ceramic electronic component in the embodiment 3 of the present invention, and is a view illustrating a layout of an opposite side inner electrode layer connected to a second side-surface electrode layer by a broken line.
Figure 18:
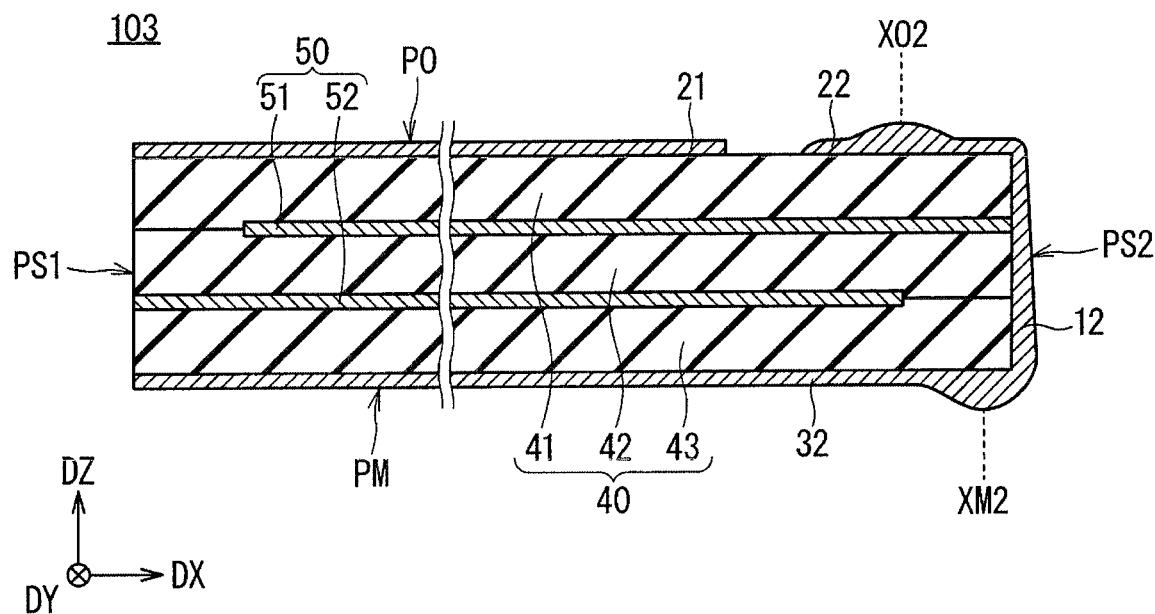
FIG. 18 is a schematic cross-sectional view along a line XVIII-XVIII in FIGS. 15 to 17.
Figure 19:
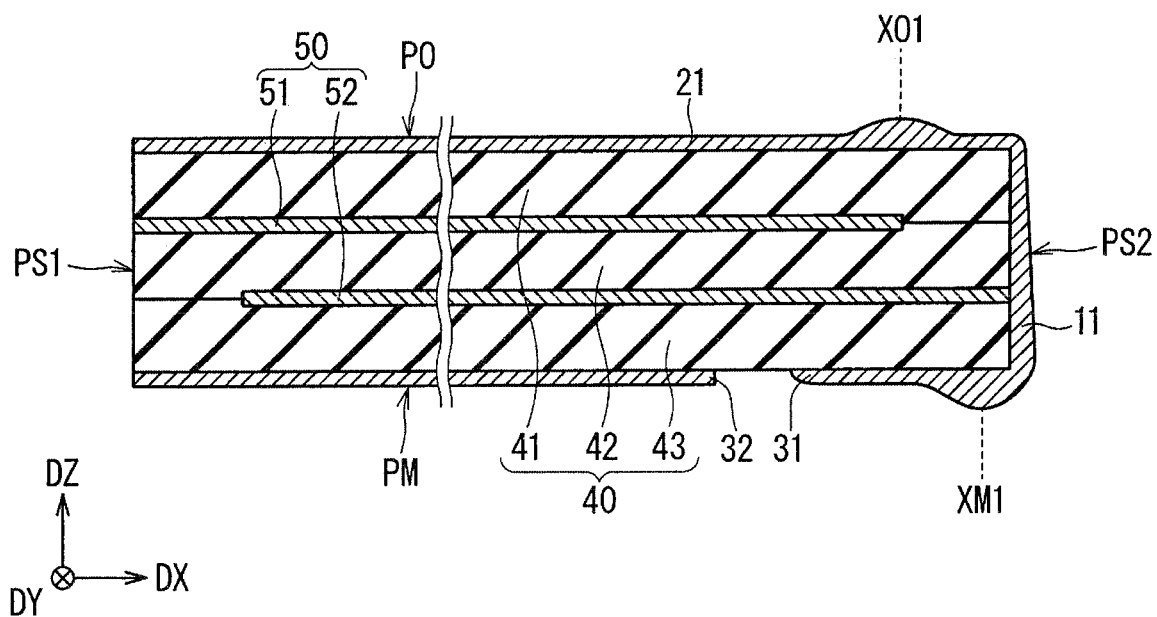
FIG. 19 is a schematic cross-sectional view along a line XIX-XIX in FIGS. 15 to 17.

FIG. 15 to FIG. 17 are top views each schematically illustrating a configuration of the laminated ceramic electronic component 103 in the present embodiment 3. A broken line in FIG. 15 indicates a layout of the first mounting-surface electrode layer 31 and the second mounting-surface electrode layer 32. A broken line in FIG. 16 indicates a layout of the mounting-side inner electrode layer 52 connected to the first side-surface electrode layer 11 (FIG. 19). A broken line in FIG. 17 indicates a layout of the opposite side inner electrode layer 51 connected to the second side-surface electrode layer 12 (FIG. 18). FIG. 18 is a schematic cross-sectional view along a line XVIII-XVIII in FIGS. 15 to 17. FIG. 19 is a schematic cross-sectional view along a line XIX-XIX in FIGS. 15 to 17.

In the present embodiment 3, the first side-surface electrode layer 11 (FIG. 19) is disposed on the second side surface PS2, differing from the embodiment 1. In the cross-sectional view (FIG. 19) including the lamination direction DZ and the length direction DX, the position XM1 in which the first mounting-surface electrode layer 31 has the maximum thickness is shifted toward the second side surface PS2 in the length direction DX with respect to the position XO1 in which the first opposite-surface electrode layer 21 has the maximum thickness.

Also in the present embodiment 3, the second side-surface electrode layer 12 (FIG. 18) is disposed on the second side surface PS2 in the manner similar to the embodiment 1. In the cross-sectional view (FIG. 18) including the lamination direction DZ and the length direction DX, the position XM2 in which the second mounting-surface electrode layer 32 has the maximum thickness is shifted toward the second side surface PS2 in the length direction DX with respect to the position XO2 in which the second opposite-surface electrode layer 22 has the maximum thickness.

In the present embodiment, corresponding to the location of the first side-surface electrode layer 11 described above, each of the first opposite-surface electrode layer 21 (refer to a solid line in FIG. 15) and the first mounting-surface electrode layer 31 (refer to the broken line in FIG. 15) reaches the second side surface PS2, thereby being connected to the first side-surface electrode layer 11 (FIG. 19). The mounting-side inner electrode layer 52 (refer to the broken line in FIG. 16) reaches the second side surface PS2, thereby being connected to the first side-surface electrode layer 11 (FIG. 19). In the meanwhile, each of the second opposite-surface electrode layer 22 (refer to the solid line in FIG. 15) and the second mounting-surface electrode layer 32 (refer to the broken line in FIG. 15) is separated from a portion in the second side surface PS2 where the first side-surface electrode layer 11 (FIG. 19) is provided. The opposite side inner electrode layer 51 (refer to the broken line in FIG. 17) is separated from a portion in the second side surface PS2 where the first side-surface electrode layer 11 (FIG. 19) is provided.

Since a configuration other than those described above is substantially the same as that of the embodiment 1 or 2 described above, the same reference numerals will be assigned to the same or corresponding constituent elements, and the description on them is not repeated. The effect approximately similar to that of the embodiment 1 or 2 can be obtained by the present embodiment.

Each embodiment described above describes in detail the actuator element to generate displacement in the length direction as the laminated ceramic electronic component, however, the laminated ceramic electronic component is not limited thereto.

While the invention has been shown and described in detail, the foregoing description is in all aspects illustrative and not restrictive. It is therefore understood that numerous modifications and variations can be devised without departing from the scope of the invention.

What is claimed is:

1. A laminated ceramic electronic component having a mounting surface which is to be joined to a mounted member using a conductive member, an opposite surface located opposite to the mounting surface in a lamination direction, a first side surface connecting the mounting surface and the opposite surface, and a second side surface connecting the mounting surface and the opposite surface and located opposite to the first side surface in a length direction, the laminated ceramic electronic component, comprising:

a first side-surface electrode layer disposed on the first side surface or the second side surface;

a second side-surface electrode layer disposed on the second side surface;

a first opposite-surface electrode layer disposed on the opposite surface and connected to the first side-surface electrode layer;

a second opposite-surface electrode layer disposed on the opposite surface, connected to the second side-surface electrode layer, and separated from the first opposite-surface electrode layer;

a first mounting-surface electrode layer disposed on the mounting surface and connected to the first side-surface electrode layer;

a second mounting-surface electrode layer disposed on the mounting surface, connected to the second side-surface electrode layer, and separated from the first mounting-surface electrode layer;

an opposite-side dielectric ceramic layer being in contact with the first opposite-surface electrode layer and the second opposite-surface electrode layer;

a mounting-side dielectric ceramic layer being in contact with the first mounting-surface electrode layer and the second mounting-surface electrode layer; and a mounting-side inner electrode layer separated from the first mounting-surface electrode layer and the second mounting-surface electrode layer by the mounting-side dielectric ceramic layer, disposed on the mounting-side dielectric ceramic layer, extending from the first side-surface electrode layer, and separated from the second side-surface electrode layer, wherein in a cross-sectional view including the lamination direction and the length direction, the second mounting-surface electrode layer has only a single maximum thickness and the second opposite-surface electrode layer has only a single maximum thickness, which are both shifted toward the first side surface in the length direction to positions that are at least a distance away from the second side surface, such that the position in which the second mounting-surface electrode layer has the single maximum thickness is shifted toward the second side surface in the length direction with respect to the position in which the second opposite-surface electrode layer has the single maximum thickness.

2. The laminated ceramic electronic component according to claim 1, wherein
each thickness of the first side-surface electrode layer, which is made of one material, and the second side-surface electrode layer, which is made of one material, increases from the opposite surface toward the mounting surface.

3. The laminated ceramic electronic component according to claim 1, wherein
the second mounting-surface electrode layer has a step-like shape on the mounting surface.

4. The laminated ceramic electronic component according to claim 1, wherein
the first mounting-surface electrode layer has a step-like shape on the mounting surface.

5. The laminated ceramic electronic component according to claim 1, wherein
the mounting-side dielectric ceramic layer has a mounting-side surface facing the mounting surface, and the mounting-side surface has a continuous concave shape in a surface profile along the length direction.

6. The laminated ceramic electronic component according to claim 5, wherein
the opposite-side dielectric ceramic layer has an opposite-side surface facing the opposite surface, and the mounting-side surface is larger than the opposite-side surface in a cross-sectional view including the lamination direction and the length direction.

7. The laminated ceramic electronic component according to claim 1, wherein
the laminated ceramic electronic component is an actuator element to generate displacement in the length direction.

8. The laminated ceramic electronic component according to claim 1, wherein
the first side-surface electrode layer is disposed on the first side surface.

9. The laminated ceramic electronic component according to claim 8, wherein
in a cross-sectional view including the lamination direction and the length direction, a position in which the first mounting-surface electrode layer has a maximum thickness is shifted toward the first side surface in the length direction with respect to a position in which the first opposite-surface electrode layer has a maximum thickness.

10. An electronic component assembly, comprising:
the laminated ceramic electronic component according to claim 1;
the mounted member having a first conductive part and a second conductive part separated from each other; and
the conductive member having a first junction part joining the first mounting-surface electrode layer to the first conductive part and a second junction part joining the second mounting-surface electrode layer to the second conductive part.

11. The electronic component assembly according to claim 10, wherein
the first side-surface electrode layer of the laminated ceramic electronic component is disposed on the first side surface, and
a mounted member has a support, and the support has a first support part supporting the first conductive part, a second support part supporting the second conductive part, and a space located between the first support part and the second support part.

12. A laminated ceramic electronic component having a mounting surface which is to be joined to a mounted member using a conductive member, an opposite surface located opposite to the mounting surface in a lamination direction, a first side surface connecting the mounting surface and the opposite surface, and a second side surface connecting the mounting surface and the opposite surface and located opposite to the first side surface in a length direction, the laminated ceramic electronic component, comprising:
a first side-surface electrode layer disposed on the first side surface or the second side surface;
a second side-surface electrode layer disposed on the second side surface;
a first opposite-surface electrode layer disposed on the opposite surface and connected to the first side-surface electrode layer;
a second opposite-surface electrode layer disposed on the opposite surface, connected to the second side-surface electrode layer, and separated from the first opposite-surface electrode layer;
a first mounting-surface electrode layer disposed on the mounting surface and connected to the second side-surface electrode layer;
a second mounting-surface electrode layer disposed on the mounting surface, connected to the second side-surface electrode layer, and separated from the first mounting-surface electrode layer;
an opposite-side dielectric ceramic layer being in contact with the first opposite-surface electrode layer and the second opposite-surface electrode layer;
a mounting-side dielectric ceramic layer being in contact with the first mounting-surface electrode layer and the second mounting-surface electrode layer; and
a mounting-side inner electrode layer separated from the first mounting-surface electrode layer and the second mounting-surface electrode layer by the mounting-side dielectric ceramic layer, disposed on the mounting-side dielectric ceramic layer, extending from the first side-surface electrode layer, and separated from the second side-surface electrode layer, wherein
in a cross-sectional view including the lamination direction and the length direction, a position in which the second mounting-surface electrode layer has a maximum thickness is shifted toward the second side surface in the length direction with respect to a position in which the second opposite-surface electrode layer has a maximum thickness, wherein
the laminated ceramic electronic component has a longitudinal surface surrounded by the mounting surface, the opposite surface, the first side surface, and the second side surface, and
a distance from the longitudinal surface to the mounting-side inner electrode layer is smaller than a thickness of the mounting-side dielectric ceramic layer.

13. A laminated ceramic electronic component having a mounting surface which is to be joined to mounted member using a conductive member, an opposite surface located opposite to the mounting surface in a lamination direction, a first side surface connecting the mounting surface and the opposite surface, and a second side surface connecting the mounting surface and the opposite surface and located opposite to the first side surface in a length direction the laminated ceramic electronic component, comprising:
- a first side-surface electrode layer disposed on the first side surface or the second side surface;
- a second side-surface electrode layer disposed on the second side surface;
- a first opposite-surface electrode layer disposed on the opposite surface and connected to the first side-surface electrode layer;
- a second opposite-surface electrode layer disposed on the opposite surface, connected to the second side-surface electrode layer, and separated from the first opposite-surface electrode layer:
- a first mounting: surface electrode layer disposed on the mounting-surface and connected to the first side-surface electrode layer;
- a second mounting-surface electrode layer disposed on the mounting surface, connected to the second side-surface electrode layer, and separated from the first mounting-surface electrode layer;
- an opposite-side dielectric ceramic layer being in contact with the first opposite-surface electrode layer and the second opposite-surface electrode layer;
- a mounting side dielectric ceramic layer being in contact with the first mounting-surface electrode layer and the second mounting-surface electrode layer; and
- a mounting-side inner electrode layer separated from the first mounting-surface electrode layer and the second mounting-surface electrode layer by the mounting-side dielectric ceramic layer, disposed on the mounting-side dielectric ceramic layer, extending from the first side-surface electrode layer, and separated from the second side-surface electrode layer, wherein
- in a cross-sectional view including the lamination direction and the length direction, a position in which the second mounting-surface electrode layer has a maximum, thickness is shifted toward the second side surface in the length direction with respect to a position in which the second opposite-surface electrode layer has a maximum thickness, wherein
- the first side-surface electrode layer is disposed on the second side surface.

14. The laminated ceramic electronic component according to claim 13, wherein
- in a cross-sectional view including the lamination direction and the length direction, a position in which the first mounting-surface electrode layer has a maximum thickness is shifted toward the second side surface in the length direction with respect to a position in which the first opposite-surface electrode layer has a maximum thickness.

* * * * *